US012610159B1

(12) United States Patent
Choi et al.

(10) Patent No.: US 12,610,159 B1
(45) Date of Patent: Apr. 21, 2026

(54) IMAGE SENSOR AND READOUT METHOD FOR PIXEL CIRCUIT THEREOF

(71) Applicant: OMNIVISION TECHNOLOGIES, INC., Santa Clara, CA (US)

(72) Inventors: Woon Il Choi, Sunnyvale, CA (US); Keiji Mabuchi, Cupertino, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 46 days.

(21) Appl. No.: 18/948,516

(22) Filed: Nov. 15, 2024

(51) Int. Cl.
  *H04N 25/59* (2023.01)
  *H04N 25/77* (2023.01)
  *H04N 25/78* (2023.01)
  *H10F 39/00* (2025.01)

(52) U.S. Cl.
  CPC ............. *H04N 25/59* (2023.01); *H04N 25/77* (2023.01); *H04N 25/78* (2023.01); *H10F 39/8037* (2025.01)

(58) Field of Classification Search
  CPC ...................................................... H04N 25/59
  See application file for complete search history.

(56) References Cited

U.S. PATENT DOCUMENTS

| | | | | |
|---|---|---|---|---|
| 11,212,457 | B2 * | 12/2021 | Dai | ...................... H04N 25/778 |
| 12,058,460 | B2 * | 8/2024 | Choi | ...................... H04N 25/59 |
| 2019/0327432 | A1 * | 10/2019 | Milkov | ................. H10F 39/809 |
| 2021/0377435 | A1 * | 12/2021 | Dai | ...................... H04N 23/741 |
| 2022/0264042 | A1 * | 8/2022 | Innocent | ............... H04N 25/59 |
| 2024/0259705 | A1 * | 8/2024 | Velichko | ................. H04N 25/59 |
| 2024/0357253 | A1 * | 10/2024 | Gao | ..................... H04N 25/77 |
| 2025/0203233 | A1 * | 6/2025 | Mikkelsen | ............. H04N 25/59 |
| 2026/0026124 | A1 * | 1/2026 | Goto | ..................... H10F 39/809 |

* cited by examiner

*Primary Examiner* — Cynthia Calderon
(74) *Attorney, Agent, or Firm* — JC ONE WORLD

(57) ABSTRACT

An image sensor and a readout method for a pixel circuit thereof are provided. In the pixel circuit, a first transistor is coupled between a floating diffusion portion and a first capacitor, and a second transistor is coupled between the first transistor and a second capacitor. A readout cycle of the pixel circuit includes a high conversion gain (HCG) readout operation, an all-capacitor readout operation, a first readout stage, a second readout stage, and a third readout stage. The HCG readout operation is used to read out an HCG sensing result. The first readout stage and the second readout stage are used to read out a low conversion gain (LCG) sensing result. The second readout stage and the third readout stage are used to read out a first medium illumination sensing result. The all-capacitor readout operation is used to read out a high illumination sensing result.

21 Claims, 18 Drawing Sheets

IMAGE SENSOR AND READOUT METHOD FOR PIXEL CIRCUIT THEREOF

BACKGROUND

Technical Field

The disclosure relates to an electronic circuit, and particularly relates to an image sensor and a readout method for a pixel circuit thereof.

Description of Related Art

Image sensors are widely used in medical, automotive, and other applications such as digital cameras, mobile phones, and security cameras. General image sensors have a limited dynamic range of about 60 dB to 70 dB while the brightness dynamic range in the real world is much larger. For instance, the brightness dynamic range of a natural scene is typically 90 dB or even larger. To capture the details in both bright highlights and dark shadows, image sensors may use high dynamic range (HDR) technology to increase the dynamic range captured. Automotive or other applications have an increasing need for very high level of dynamic range to accommodate a brighter light level. How to realize an image sensor with HDR is one of the many technical challenges in this field.

SUMMARY

The disclosure provides an image sensor and a readout method for a pixel circuit thereof, which realize high dynamic range (HDR).

According to an embodiment of the disclosure, the image sensor includes a control circuit and a pixel array. The pixel array is controlled by the control circuit. Each pixel circuit of the pixel array includes a photosensitive element, a floating diffusion portion, a transfer transistor, a source follower circuit, a first transistor, a second transistor, a first capacitor, and a second capacitor. The transfer transistor is coupled between the photosensitive element and the floating diffusion portion. The source follower circuit is coupled between a corresponding readout line of the pixel array and the floating diffusion portion. A first terminal of the first transistor is coupled to the floating diffusion portion. A first terminal of the first capacitor is coupled to a second terminal of the first transistor. A first terminal of the second transistor is coupled to the second terminal of the first transistor. A first terminal of the second capacitor is coupled to a second terminal of the second transistor. A readout cycle of the pixel circuit includes a high conversion gain (HCG) readout operation, a low conversion gain (LCG) and lateral overflow integration capacitor (LOFIC) readout operation, and an all-capacitor readout operation. The HCG readout operation read outs an HCG sensing result corresponding to a first photosensitive charge value of the photosensitive element. The all-capacitor readout operation reads out a high illumination sensing result corresponding to a second photosensitive charge value of the photosensitive element, the floating diffusion portion, the first capacitor, and the second capacitor. The LCG and LOFIC readout operation includes a first readout stage, a second readout stage, and a third readout stage. In the first readout stage, an overflow charge value of the floating diffusion portion and the first capacitor is read out before the transfer transistor transfers photosensitive charges of the photosensitive element to the floating diffusion portion. In the second readout stage, a third photosensitive charge value of the photosensitive element, the floating diffusion portion, and the first capacitor is read out, wherein a difference between the third photosensitive charge value and the overflow charge value serves as an LCG sensing result. In the third readout stage, a reset charge value of the floating diffusion portion and the first capacitor is read out after the photosensitive element, the floating diffusion portion, and the first capacitor are reset, wherein a difference between the third photosensitive charge value and the reset charge value serves as a first medium illumination sensing result.

According to an embodiment of the disclosure, the readout method for a pixel circuit includes: performing an HCG readout operation in a readout cycle of the pixel circuit to read out an HCG sensing result corresponding to a first photosensitive charge value of a photosensitive element of the pixel circuit; performing an all-capacitor readout operation in the readout cycle to read out a high illumination sensing result corresponding to a second photosensitive charge value of the photosensitive element, a floating diffusion portion, a first capacitor, and a second capacitor; and performing an LCG and LOFIC readout operation in the readout cycle. The LCG and LOFIC readout operation includes a first readout stage, a second readout stage, and a third readout stage. In the first readout stage, an overflow charge value of the floating diffusion portion and the first capacitor is read out before a transfer transistor transfers photosensitive charges of the photosensitive element to the floating diffusion portion. In the second readout stage, a third photosensitive charge value of the photosensitive element, the floating diffusion portion, and the first capacitor is read out, wherein a difference between the third photosensitive charge value and the overflow charge value serves as an LCG sensing result. In the third readout stage, a reset charge value of the floating diffusion portion and the first capacitor is read out after the photosensitive element, the floating diffusion portion, and the first capacitor are reset, wherein a difference between the third photosensitive charge value and the reset charge value serves as a first medium illumination sensing result.

Based on the above, one readout cycle of the pixel circuit according to embodiments of the disclosure includes one HCG readout operation, one LCG and LOFIC readout operation (including a first readout stage, a second readout stage, and a third readout stage), and one all-capacitor readout operation. The all-capacitor readout operation is used to read out the high illumination sensing result (applicable to a high illumination). The second readout stage and the third readout stage are used to read out the first medium illumination sensing result (applicable to a first medium illumination lower than the high illumination). The first readout stage and the second readout stage are used to read out the LCG sensing result (applicable to a second medium illumination lower than the first medium illumination). The HCG readout operation is used to read out the HCG sensing result (applicable to a low illumination lower than the second medium illumination). Thereby, the image sensor and the readout method realize the HDR function.

To make the aforementioned features and advantages of the disclosure more comprehensible, exemplary embodiments are described in detail hereinafter in conjunction with the accompanying figures.

DESCRIPTION OF THE EMBODIMENTS

Figure 1:
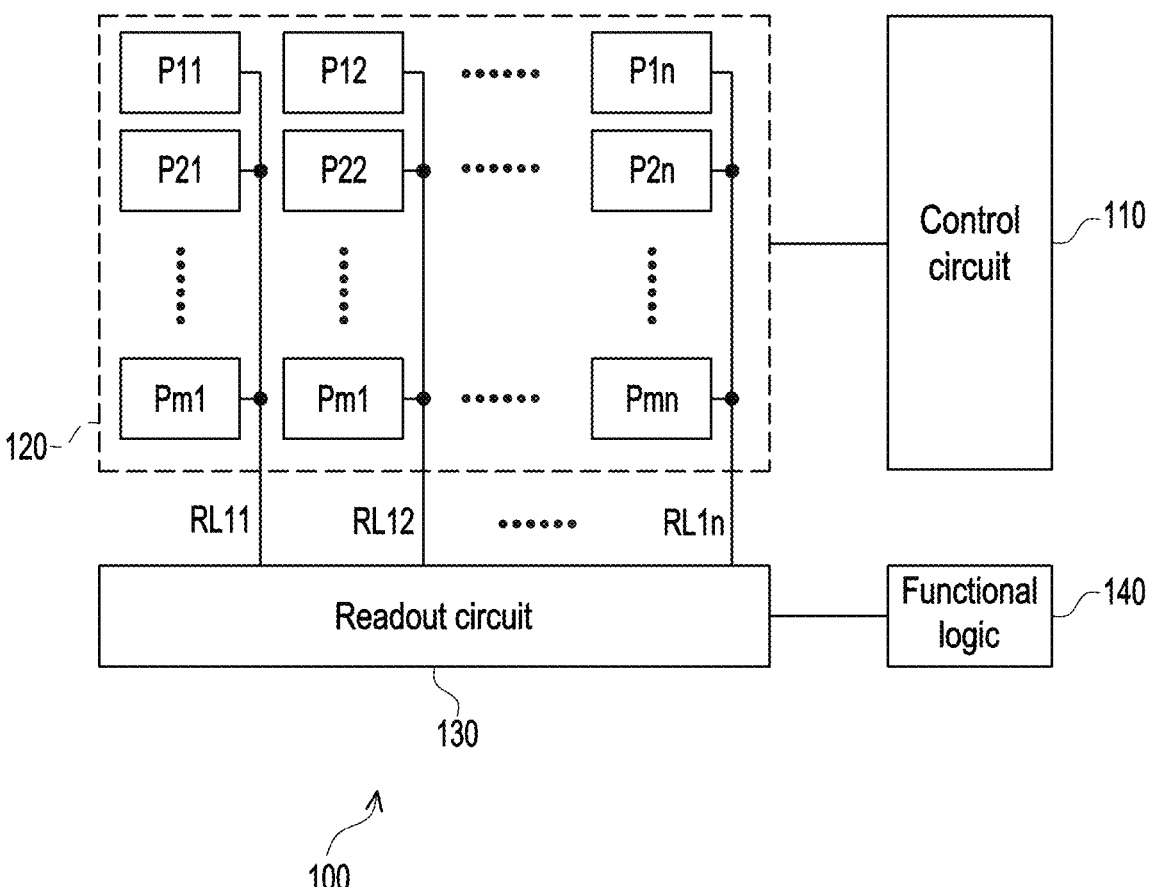
FIG. 1 is a circuit block diagram of an image sensor according to an embodiment of the disclosure.

The term "couple (or connect)" used in this specification (including the claims) may refer to any direct or indirect connection means. For example, when it is described that the first device is coupled (or connected) to the second device, it should be interpreted that the first device may be directly connected to the second device, or the first device may be indirectly connected to the second device through other devices or some connection means. The terms "first", "second", and so on used in this specification (including the claims) are used to name the elements or distinguish different embodiments or ranges, and are not intended to define the upper or lower limit of the number of elements nor to limit the order of elements. In addition, elements/structures/ steps denoted by the same reference numerals in the drawings and embodiments represent the same or similar parts as appropriate. Descriptions of elements/structures/steps using the same reference numerals or the same names in different embodiments may serve as reference for each other.

Exemplary embodiments of an image sensor and a readout method for a pixel circuit thereof will be described in detail hereinafter. The image sensor includes a pixel array with multiple pixel circuits. The pixel circuit includes a lateral overflow integration capacitor (LOFIC). The LOFIC can increase the full well capacity (FWC) of the pixel circuit, thereby improving the high dynamic range (HDR) of the image sensor. The LOFIC is positively correlated with the FWC. In other words, the FWC of the pixel circuit increases as the capacity of the LOFIC used in the pixel circuit increases.

FIG. 1 is a circuit block diagram of an image sensor 100 according to an embodiment of the disclosure. The image sensor 100 shown in FIG. 1 includes a control circuit 110, a pixel array 120, a readout circuit 130, and functional logic 140. The pixel array 120 includes multiple pixel circuits (for example, pixel circuits P11, P12, . . . , P1n, P21, P22, . . . , P2n, Pm1, Pm2, . . . , Pmn shown in FIG. 1). Each of the pixel circuits P11 to Pmn is coupled to a corresponding readout line (bit line) of the pixel array 120. For example, the pixel circuits P11 to Pm1 are coupled to a readout line RL11, the pixel circuits P12 to Pm2 are coupled to a readout line RL12, and the pixel circuits P1n to Pmn are coupled to a readout line RL1n.

At least one photosensitive element (not shown in FIG. 1), which is for example a photodiode, is disposed in each of the pixel circuits P11 to Pmn to generate photosensitive charges in response to incident light. The pixel circuits P11 to Pmn are capable of providing HDR image signals. The overflow charges generated by the photosensitive element under high illumination may be transferred to the LOFIC in the pixel circuit. The LOFIC is reverse-biased during the idle period to compensate or offset the residual charges in the LOFIC. The photosensitive charges generated by the photosensitive element are transferred to a floating diffusion portion in the pixel circuit, and a source follower circuit in the pixel circuit then converts the photosensitive charges into a pixel signal. The readout circuit 130 reads out the pixel signals of the pixel circuits P11 to Pmn via the readout lines RL11 to RL1n. Based on the actual circuit design, the readout circuit 130 may further include an analog to digital converter (ADC) and other circuits to convert the pixel signals into image data. The readout circuit 130 then provides the image data to the functional logic 140. The functional logic 140 is capable of performing image processing (for example, cropping, rotation, red-eye removal, brightness adjustment, contrast adjustment, or other image processing) on the image data.

The control circuit 110 is coupled to the pixel array 120 to control the sensing operations of the pixel circuits P11 to Pmn in the pixel array 120. For example, the control circuit 110 may generate a rolling shutter signal or a shutter signal for controlling image acquisition. In other embodiments, image acquisition may be synchronized with lighting effects such as flash. In some embodiments, the control circuit 110, the readout circuit 130, and/or the functional logic 140 may be implemented as hardware circuits according to different circuit designs. In other embodiments, the control circuit 110, the readout circuit 130, and/or the functional logic 140 may be implemented as one of multiple combinations of hardware, firmware, and software (that is, programs).

In terms of hardware, the control circuit 110, the readout circuit 130, and/or the functional logic 140 may be implemented as a logic circuit on an integrated circuit. For example, the functions of the control circuit 110, the readout circuit 130, and/or the functional logic 140 may be implemented in various logic blocks, modules, and circuits in one or more hardware controllers, microcontrollers, hardware processors, microprocessors, application-specific integrated circuits (ASICs), digital signal processors (DSPs), field programmable gate arrays (FPGAs), central processing units (CPUs), and/or other processing units. The functions of the control circuit 110, the readout circuit 130, and/or the functional logic 140 may be implemented as hardware circuits, such as various logic blocks, modules, and circuits in an integrated circuit, using hardware description languages (such as Verilog HDL or VHDL) or other suitable programming languages.

In one embodiment, the image sensor 100 may be implemented on a single semiconductor wafer. In another embodiment, the image sensor 100 may be implemented on stacked semiconductor wafers. For example, the pixel array 120 may be implemented on a pixel wafer, and the readout circuit 130, the control circuit 110, and the functional logic 140 may be implemented on an ASIC wafer, in which the pixel wafer and the ASIC wafer are stacked and interconnected through bonding or through substrate vias (TSVs). In practical applications, the bonding may be hybrid bonding, oxide bonding, or other bonding. As another example, the pixel array 120 and the control circuit 110 may be implemented on a pixel wafer, and the readout circuit 130 and the functional logic 140 may be implemented on an ASIC wafer.

In terms of software and/or firmware, the functions of the control circuit 110, the readout circuit 130, and/or the functional logic 140 may be implemented as programming codes. For example, general programming languages (such as C, C++, or composition language) or other suitable programming languages may be used to implement the control circuit 110, the readout circuit 130, and/or the functional logic 140. The programming codes may be recorded/stored in a "non-transitory machine-readable storage medium". In some embodiments, the non-transitory machine-readable storage medium may include, for example, a semiconductor memory and/or a storage device. An electronic device (such as computer, CPU, hardware controller, microcontroller, hardware processor, or microprocessor) may read and execute the programming codes from the non-transitory machine-readable storage medium to implement the functions of the control circuit 110, the readout circuit 130, and/or the functional logic 140.

In practical applications, the image sensor 100 may be included in a cell phone, a laptop computer, an endoscope, a security camera, an imaging device for automobile, or other application products. Besides, the image sensor 100 may be coupled to other hardware components, such as processors (general-purpose processors or other processors), memory components, output components (USB ports, wireless transmitters, HDMI ports, etc.), lighting/flash components, electronic input components (keyboards, touch displays, trackpads, mice, microphones, etc.), displays, or the like. Other hardware components may send instructions to the image sensor 100 and extract image data from the image sensor 100.

Figure 2:
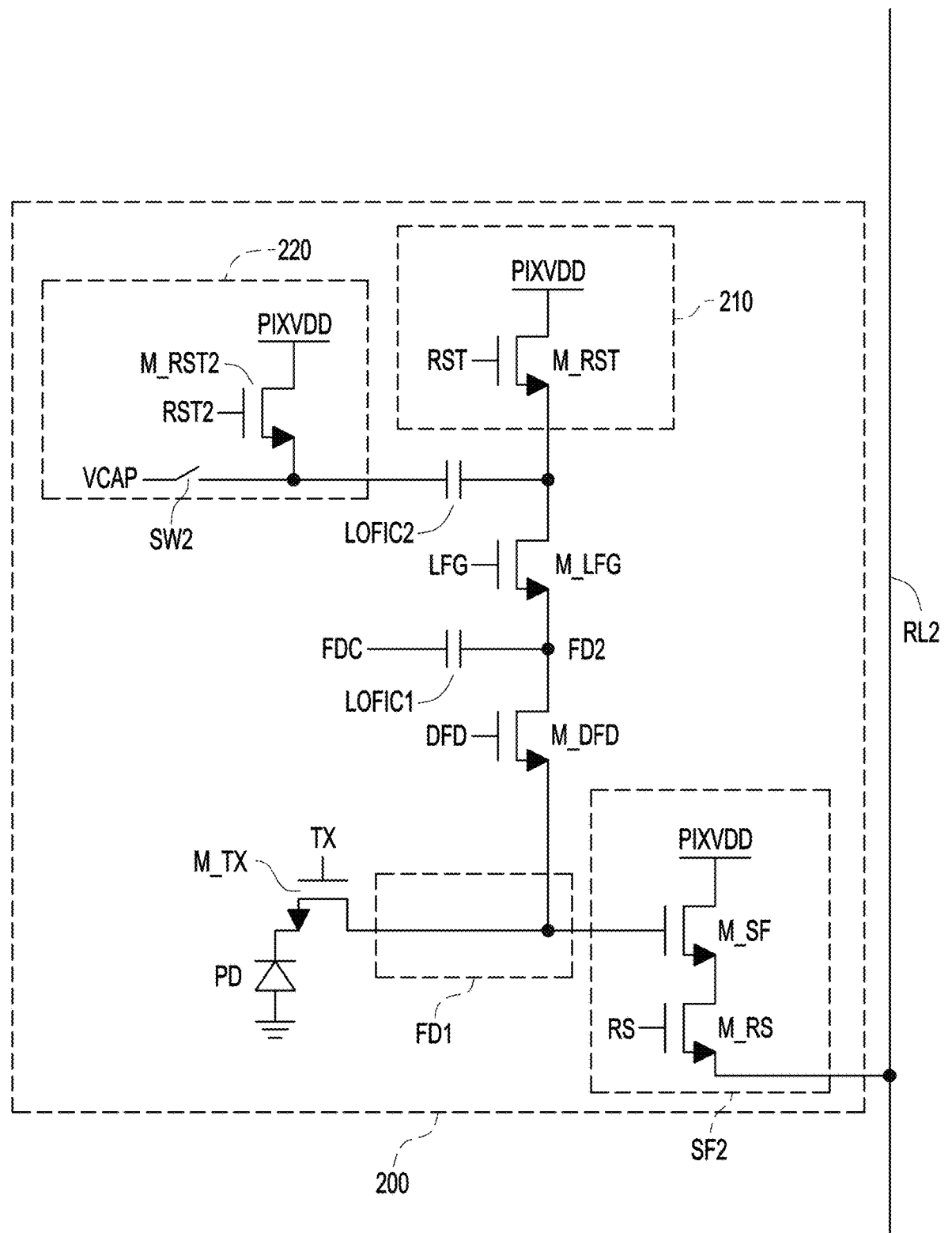
FIG. 2 is a circuit block diagram of a pixel circuit according to an embodiment of the disclosure.

FIG. 2 is a circuit block diagram of a pixel circuit 200 according to an embodiment of the disclosure. The pixel circuit 200 and a readout line RL2 shown in FIG. 2 may serve as one of many exemplary embodiments of the pixel circuits P11 to Pmn and the readout lines RL11 to RL1n shown in FIG. 1. For details of the pixel circuit 200 and the readout line RL2 shown in FIG. 2, please refer to the above descriptions of the pixel circuits P11 to Pmn and the readout lines RL11 to RL1n shown in FIG. 1. In the embodiment shown in FIG. 2, the pixel circuit 200 includes a photosensitive element (for example, a photodiode PD or other photosensitive elements), a floating diffusion portion FD1, a transfer transistor M_TX, a source follower circuit SF2, a transistor M_DFD, a transistor M_LFG, a first capacitor (for example, LOFIC LOFIC1), a second capacitor (for example, LOFIC LOFIC2), a reset circuit 210, and a reset circuit 220. The photodiode PD generates photosensitive charges in response to incident light. The transfer transistor M_TX is coupled between the photodiode PD and the floating diffusion portion FD1. In an environment of medium or high illumination, excess photosensitive charges of the photodiode PD may overflow from the photodiode PD to the floating diffusion portion FD1 through the transfer transistor M_TX.

The control terminal (for example, gate) of the transfer transistor M_TX is coupled to the control circuit 110 to receive a transfer control signal TX. In response to the transfer control signal TX, the transfer transistor M_TX determines whether to transfer the photosensitive charges from the photodiode PD to the floating diffusion portion FD1. The capacity of the floating diffusion portion FD1 is provided by a physical capacitor (not shown) and/or a parasitic capacitor (not shown) in the floating diffusion portion FD1. Generally, the floating diffusion portion FD1 has a relatively small capacity to facilitate a high conversion gain (HCG) readout operation.

The source follower circuit SF2 is coupled between the corresponding readout line RL2 of the pixel array and the floating diffusion portion FD1. In the embodiment shown in FIG. 2, the source follower circuit SF2 includes a source follower transistor M_SF and a row select transistor M_RS. The control terminal (for example, gate) of the source follower transistor M_SF is coupled to the floating diffusion portion FD1. The first terminal (for example, drain) of the source follower transistor M_SF is coupled to a pixel voltage source PIXVDD. The control terminal (for example, gate) of the row select transistor M_RS is coupled to the control circuit 110 to receive a row select signal RS. The first terminal (for example, drain) of the row select transistor M_RS is coupled to the second terminal (for example, source) of the source follower transistor M_SF. The second terminal (for example, source) of the row select transistor M_RS is coupled to the corresponding readout line RL2.

The transistor M_DFD may serve as a double floating diffusion (DFD) transistor. The control terminal (for example, gate) of the transistor M_DFD is coupled to the control circuit 110 to receive a double floating diffusion signal DFD. The first terminal (for example, source) of the transistor M_DFD is coupled to the floating diffusion portion FD1. The second terminal (for example, drain) of the transistor M_DFD is coupled to a floating diffusion node FD2. The first terminal of the LOFIC LOFIC1 (first capacitor) is coupled to the second terminal of the transistor M_DFD. The second terminal of the LOFIC LOFIC1 is coupled to the control circuit 110 to receive a floating diffusion capacitor signal FDC. The capacity of the LOFIC LOFIC1 is greater than the capacity of the floating diffusion portion FD1. The floating diffusion portion FD1 has a parasitic capacitor or a physical capacitor (not shown) to provide the capacity of the floating diffusion portion FD1. The LOFIC LOFIC1 may include a metal-oxide-metal (MOM) capacitor or other capacitor components based on the actual circuit design. In response to an environment of medium illumination, the LOFIC LOFIC1 may receive excess photosensitive charges (overflow charges) from the photodiode PD through the transfer transistor M_TX and the transistor M_DFD.

The control terminal (for example, gate) of the transistor M_LFG is coupled to the control circuit 110 to receive a control signal LFG. The first terminal (for example, source) of the transistor M_LFG is coupled to the second terminal of the transistor M_DFD. The second terminal (for example, drain) of the transistor M_LFG is coupled to the reset circuit 210. The reset circuit 210 is controlled by the control circuit 110 to selectively reset the pixel circuit 200. In the embodiment shown in FIG. 2, the reset circuit 210 includes a reset transistor M_RST. The reset transistor M_RST is coupled between the second terminal of the transistor M_LFG and a reset voltage source (for example, pixel voltage source PIXVDD or other voltage sources). The reset transistor M_RST switches in response to the reset signal RST from the control circuit 110. For example, the reset transistor M_RST is turned on during the idle period, and the reset transistor M_RST is turned off during the integration period.

The first terminal of the LOFIC LOFIC2 (second capacitor) is coupled to the second terminal of the transistor M_LFG. The capacity of the LOFIC LOFIC2 is greater than the capacity of the LOFIC LOFIC1. Based on the actual circuit design, the LOFIC LOFIC2 may include a three-dimensional (3D) metal-insulator-metal (MIM) capacitor or other capacitor components, and the insulator material for the LOFIC LOFIC2 may include aluminum oxide ($Al_2O_3$), zirconium oxide ($ZrO_2$), hafnium oxide (HfO), or other insulating materials. In response to an environment of high illumination, the LOFIC LOFIC2 may receive excess photosensitive charges (overflow charges) from the photodiode PD through the transfer transistor M_TX, the transistor M_DFD, and the transistor M_LFG.

The reset circuit 220 is coupled to the second terminal of the LOFIC LOFIC2. In the embodiment shown in FIG. 2, the reset circuit 220 includes a reset transistor M_RST2 and a switch SW2. The reset transistor M_RST2 is coupled between the second terminal of the LOFIC LOFIC2 and a reset voltage source (for example, pixel voltage source PIXVDD or other voltage sources). The reset transistor M_RST2 switches in response to a reset signal RST2 from the control circuit 110. The switch SW2 is coupled between the second terminal of the LOFIC LOFIC2 and a bias voltage source VCAP. The bias voltage provided by the bias voltage source VCAP is less than the reset voltage provided by the reset voltage source. The bias voltage source VCAP is coupled to the LOFIC LOFIC2 through the switch SW2 to selectively provide a high capacitor bias voltage or a low capacitor bias voltage to the LOFIC LOFIC2. The high capacitor bias voltage is greater than the low capacitor bias voltage. For instance, the high capacitor bias voltage may be in a range of 2.0 V to 3.5 V, and the low capacitor bias voltage may be in a range of 0 V to 2.0 V.

Figure 3:
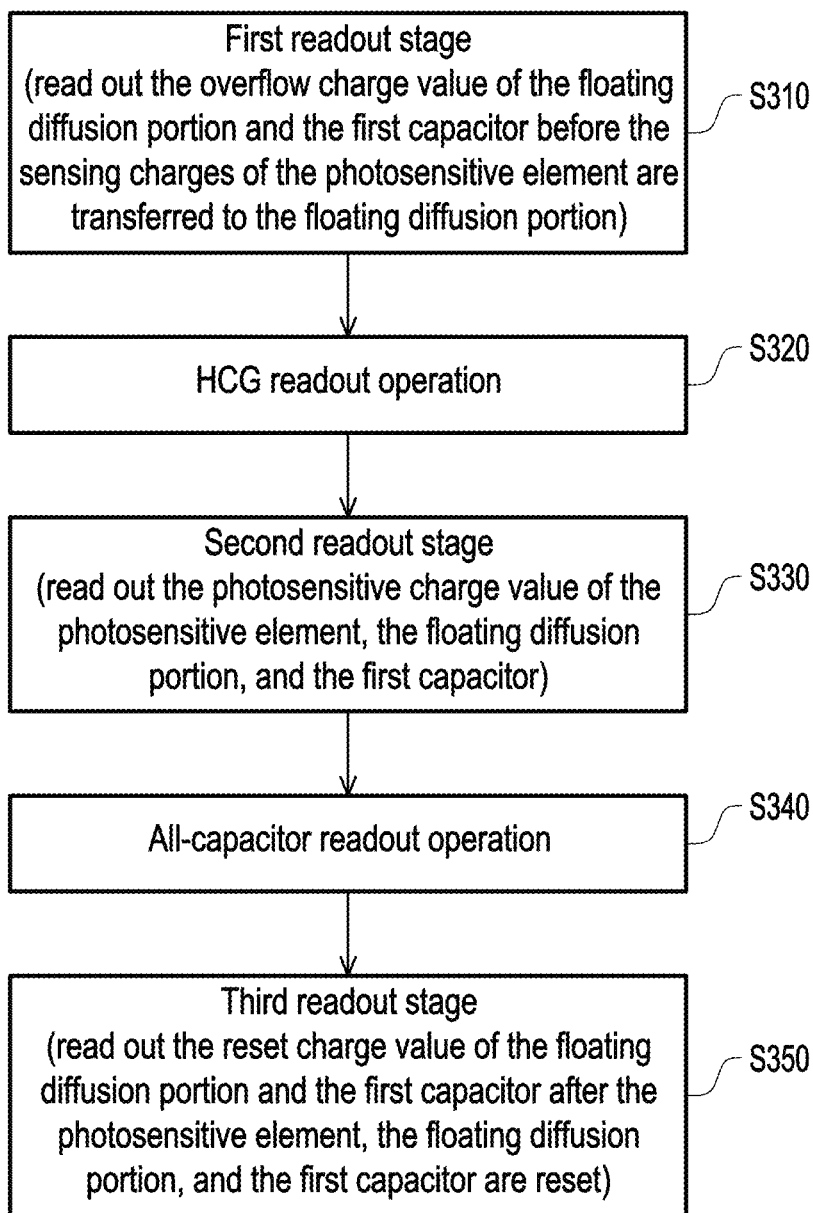
FIG. 3 is a flow chart of a readout method for a pixel circuit according to an embodiment of the disclosure.

FIG. 3 is a flow chart of a readout method for a pixel circuit according to an embodiment of the disclosure. In the embodiment shown in FIG. 3, a readout cycle performed on the pixel circuit 200 by the control circuit 110 includes an HCG readout operation, a low conversion gain (LCG) and LOFIC readout operation, and an all-capacitor readout operation. One of many exemplary embodiments of the HCG readout operation is illustrated by step S320 shown in FIG. 3, one of many exemplary embodiments of the LCG and LOFIC readout operation is illustrated by steps S310, S330, and S350 shown in FIG. 3, and one of many exemplary embodiments of the all-capacitor readout operation is illustrated by step S340 shown in FIG. 3. The LCG and LOFIC readout operation includes a first readout stage, a second readout stage, and a third readout stage.

Referring to FIG. 1, FIG. 2, and FIG. 3, the control circuit 110 performs the first readout stage in step S310. That is, before the transfer transistor M_TX transfers the photosensitive charges of the photodiode PD (photosensitive element) to the floating diffusion portion FD1, the readout circuit 130 reads out the overflow charge value of the floating diffusion portion FD1 and the LOFIC LOFIC1 through the source follower circuit SF2. The control circuit 110 performs the HCG readout operation in step S320 to read out the HCG sensing result corresponding to the first photosensitive charge value of the photodiode PD. The control circuit 110 performs the second readout stage in step S330 to read out the third photosensitive charge value of the photodiode PD, the floating diffusion portion FD1, and the LOFIC LOFIC1. The difference between the third photosensitive charge value in step S330 and the overflow charge value in step S310 serves as the LCG sensing result.

The control circuit 110 performs the all-capacitor readout operation in step S340 to read out the high illumination sensing result corresponding to the second photosensitive charge value of the photodiode PD, the floating diffusion portion FD1, the LOFIC LOFIC1, and the LOFIC LOFIC2. The control circuit 110 performs the third readout stage in step S350. That is, after the photodiode PD, the floating diffusion portion FD1, and the LOFIC LOFIC1 are reset, the readout circuit 130 reads out the reset charge value of the floating diffusion portion FD1 and the LOFIC LOFIC1 through the source follower circuit SF2. The difference between the third photosensitive charge value in step S330 and the reset charge value in step S350 serves as the first medium illumination sensing result.

In summary, one readout cycle for the pixel circuit 200 includes one HCG readout operation, one LCG and LOFIC readout operation, and one all-capacitor readout operation.

The LCG and LOFIC readout operation includes the first readout stage, the second readout stage, and the third readout stage. The HCG readout operation is used to read out the HCG sensing result, and the HCG sensing result may be applied to a low illumination scenario. The first readout stage and the second readout stage are used to read out the LCG sensing result, and the LCG sensing result may be applied to a second medium illumination scenario that has a higher illumination than low illumination. The second readout stage and the third readout stage are used to read out the first medium illumination sensing result, and the first medium illumination sensing result may be applied to a first medium illumination scenario that has a higher illumination than second medium illumination. The all-capacitor readout operation is used to read out the high illumination sensing result, and the high illumination sensing result may be applied to a high illumination scenario. Thereby, the image sensor 100 and the readout method realize the HDR function.

Figure 4:
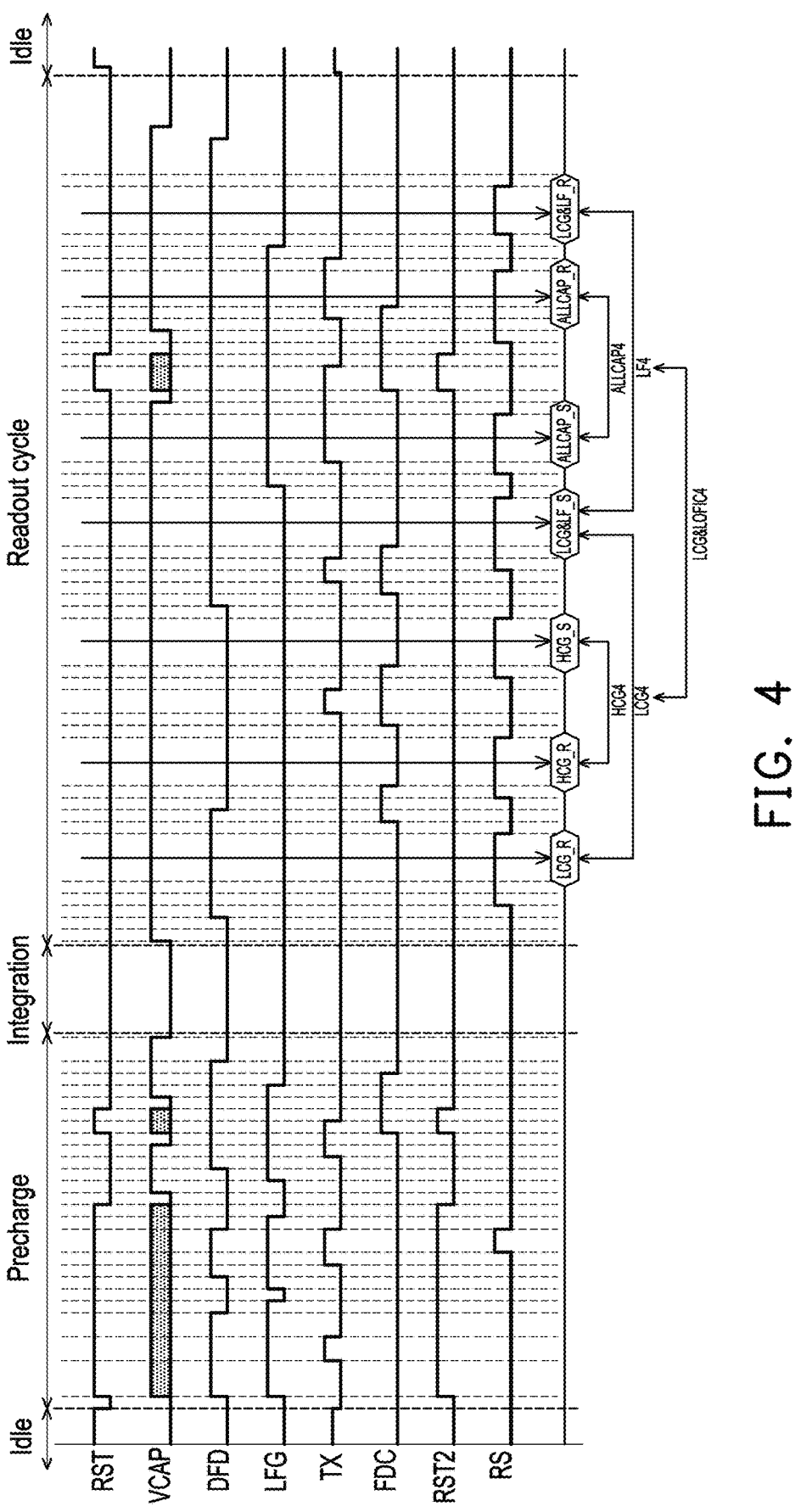
FIG. 4 is an operational diagram showing one readout cycle of a pixel circuit according to an embodiment of the disclosure.

FIG. 4 is an operational diagram showing one readout cycle of a pixel circuit according to an embodiment of the disclosure. In the embodiment shown in FIG. 4, one readout cycle includes one HCG readout operation HCG4, one LCG and LOFIC readout operation LCG&LOFIC4, and one all-capacitor readout operation ALLCAP4. The signal timing shown in FIG. 4 may be one of many examples of the reset signal RST, the bias voltage source VCAP, the double floating diffusion signal DFD, the control signal LFG, the transfer control signal TX, the floating diffusion capacitor signal FDC, the reset signal RST2, and the row select signal RS shown in FIG. 2.

Referring to FIG. 2 and FIG. 4, the pixel circuit 200 cycles through idle, precharge, integration, and readout cycle when generating pixel data. During the idle period, the reset signal RST turns on the reset transistor M_RST, the bias voltage source VCAP outputs a low bias voltage (for example, 1 to 2 volts), and the reset signal RST2 turns off the reset transistor M_RST2. Therefore, the LOFIC LOFIC2 is reverse-biased during the idle period to compensate or offset the residual charges in the LOFIC LOFIC2. The double floating diffusion signal DFD, the control signal LFG, the transfer control signal TX, the floating diffusion capacitor signal FDC, and the row select signal RS are at low level (for example, 0 volts) during the idle period. The idle period may be defined in a range of 3 milliseconds to 23 milliseconds based on the auto-zero discharge time required for the LOFIC LOFIC2 or based on the exposure (or integration) time required. The duration of the idle period may be greater than the duration of the precharge period. For example, the idle period may be 3 milliseconds, and the precharge period may be less than or equal to 5 microseconds.

The precharge period comes after the idle period. The reset signals RST and RST2 turn on the reset transistors M_RST and M_RST2. The bias voltage source VCAP may enter a high impedance (Hi-Z) state by turning off the switch SW2. The control signal LFG turns on the transistor M_LFG, the double floating diffusion signal DFD turns on the transistor M_DFD, and the transfer control signal TX turns on the transfer transistor M_TX. During the precharge period, the reset voltage source (for example, pixel voltage source PIXVDD or other voltage sources) resets the photodiode PD, the floating diffusion portion FD1, and the LOFIC LOFIC1 through the reset transistor M_RST. During the precharge period, the reset voltage source (for example, pixel voltage source PIXVDD or other voltage sources) resets both terminals of the LOFIC LOFIC2 to the reset voltage through the reset transistors M_RST and M_RST2.

During the precharge period, the reset signals RST and RST2 change from high voltage level to low voltage level, thereby turning off the reset transistors M_RST and M_RST2 before the bias voltage source VCAP switches from the Hi-Z state to the normal bias voltage.

Then, the transfer control signal TX turns off the transfer transistor M_TX, and the reset signal RST turns off the reset transistor M_RST, so that the bias voltage source VCAP changes from the Hi-Z state back to the bias voltage supply state by turning on the switch SW2. The bias voltage source VCAP may supply a low bias voltage (for example, 1 to 2 volts). The double floating diffusion signal DFD turns off the transistor M_DFD, the control signal LFG turns off the transistor M_LFG, and the row select signal RS turns off the row select transistor M_RS.

The integration period (exposure period) comes after the precharge period. During the integration period, all the control signals are at low level. The bias voltage source VCAP supplies a low bias voltage (for example, 1 to 2 volts). During the integration period, the photodiode PD generates photosensitive charges in response to incident light. In an environment of medium illumination, the excess charges of the photodiode PD may overflow to the floating diffusion portion FD1 and the LOFIC LOFIC1 through the transfer transistor M_TX and the transistor M_DFD. In an environment of high illumination, the excess charges of the photodiode PD may overflow to the floating diffusion portion FD1, the LOFIC LOFIC1, and the LOFIC LOFIC2 through the transfer transistor M_TX, the transistor M_DFD, and the transistor M_LFG.

The readout cycle comes after the integration period. The readout cycle includes the HCG readout operation HCG4, the LCG and LOFIC readout operation LCG&LOFIC4, and the all-capacitor readout operation ALLCAP4. The HCG readout operation HCG4 includes a readout stage HCG_R and a readout stage HCG_S. The readout stage HCG_R is used for the source follower circuit SF2 to read out the original charge value of the floating diffusion portion FD1 before the transfer transistor M_TX transfers the photosensitive charges of the photodiode PD (photosensitive element) to the floating diffusion portion FD1. The readout stage HCG_S is used for the source follower circuit SF2 to read out the photosensitive charge value of the floating diffusion portion FD1 after the transfer transistor M_TX transfers the photosensitive charges of the photodiode PD to the floating diffusion portion FD1. The difference between the photosensitive charge value in the readout stage HCG_S and the original charge value in the readout stage HCG_R serves as the HCG sensing result. Therefore, the HCG readout operation HCG4 realizes a correlated double sampling (CDS) function. The HCG sensing result may serve as a low illumination sensing result (applicable to low illumination).

The all-capacitor readout operation ALLCAP4 includes a readout stage ALLCAP_S and a readout stage ALLCAP_R. The readout stage ALLCAP_S is used for the source follower circuit SF2 to read out the photosensitive charge value of the photodiode PD (photosensitive element), the floating diffusion portion FD1, the LOFIC LOFIC1, and the LOFIC LOFIC2 when the transfer transistor M_TX, the transistor M_DFD, and the transistor M_LFG are turned on. The readout stage ALLCAP_R is used for the source follower circuit SF2 to read out the reset charge value of the photodiode PD, the floating diffusion portion FD1, the LOFIC LOFIC1, and the LOFIC LOFIC2 after the photodiode PD, the floating diffusion portion FD1, the LOFIC LOFIC1, and the LOFIC LOFIC2 are all reset. The difference between the photosensitive charge value in the readout stage ALLCAP_S and the reset charge value in the readout stage ALLCAP_R serves as a high illumination sensing result (applicable to high illumination). Therefore, the HCG readout operation HCG4 equivalently realizes a CDS function.

The LCG and LOFIC readout operation LCG&LOFIC4 includes a first readout stage LCG_R, a second readout stage LCG&LF_S, and a third readout stage LCG&LF_R. The first readout stage LCG_R is used for the source follower circuit SF2 to read out the overflow charge value of the floating diffusion portion FD1 and the LOFIC LOFIC1 before the transfer transistor M_TX transfers the photosensitive charges of the photodiode PD (photosensitive element) to the floating diffusion portion FD1. The second readout stage LCG&LF_S is used for the source follower circuit SF2 to read out the photosensitive charge value of the photodiode PD, the floating diffusion portion FD1, and the LOFIC LOFIC1. The difference between the photosensitive charge value in the second readout stage LCG&LF_S and the overflow charge value in the first readout stage LCG_R may serve as the LCG sensing result LCG4. The LCG sensing result LCG4 serves as a second medium illumination sensing result. Therefore, the first readout stage LCG_R and the second readout stage LCG&LF_S realize a CDS function.

The third readout stage LCG&LF_R is used for the source follower circuit SF2 to read out the reset charge value of the floating diffusion portion FD1 and the LOFIC LOFIC1 after the photodiode PD (photosensitive element), the floating diffusion portion FD1, and the LOFIC LOFIC1 are reset. The difference between the photosensitive charge value in the second readout stage LCG&LF_S and the reset charge value in the third readout stage LCG&LF_R serves as the first medium illumination sensing result LF4. Therefore, the second readout stage LCG&LF_S and the third readout stage LCG&LF_R equivalently realize a CDS function.

The highest illumination to which the high illumination sensing result of the all-capacitor readout operation ALLCAP4 is applicable is higher than the highest illumination to which the first medium illumination sensing result LF4 is applicable. The highest illumination to which the first medium illumination sensing result LF4 is applicable is higher than the highest illumination to which the second medium illumination sensing result (LCG sensing result LCG4) is applicable. The highest illumination to which the second medium illumination sensing result (LCG sensing result LCG4) is applicable is higher than the highest illumination to which the low illumination sensing result of the HCG readout operation HCG4 is applicable. Therefore, the image sensor 100 realizes the HDR function.

FIG. 5 to FIG. 17 are diagrams showing the distribution of photosensitive charges in the pixel circuit during different operational stages according to an embodiment of the disclosure. FIG. 5 to FIG. 17 may be cross-referenced with FIG. 4. The upper part of FIG. 5 to FIG. 17 shows again the first readout stage LCG_R, the readout stage HCG_R, the readout stage HCG_S, the second readout stage LCG&LF_S, the readout stage ALLCAP_S, the readout stage ALLCAP_R, and the third readout stage LCG&LF_R as shown in FIG. 4, and indicates the current time point.

The lower part of FIG. 5 to FIG. 17 shows the distribution of photosensitive charges in the photodiode PD (photosensitive element), the floating diffusion portion FD1, the LOFIC LOFIC1, and the LOFIC LOFIC2 shown in FIG. 2 under different illumination conditions (from bright to dark: high illumination, first medium illumination, second medium illumination, and low illumination). For details of the photodiode PD, the transfer transistor M_TX, the floating diffusion portion FD1, the transistor M_DFD, the LOFIC LOFIC1, the transistor M_LFG, the LOFIC LOFIC2, and the transistor M_RST shown in FIG. 5 to FIG. 17, please refer to the descriptions related to FIG. 2, which will not be repeated here. The photodiode PD, the floating diffusion portion FD1, the LOFIC LOFIC1, and the LOFIC LOFIC2 shown in FIG. 5 to FIG. 17 may be regarded as charge containers of various sizes, while the transfer transistor M_TX, the transistor M_DFD, the transistor M_LFG, and the transistor M_RST shown in FIG. 5 to FIG. 17 may be regarded as valves.

Figure 5:
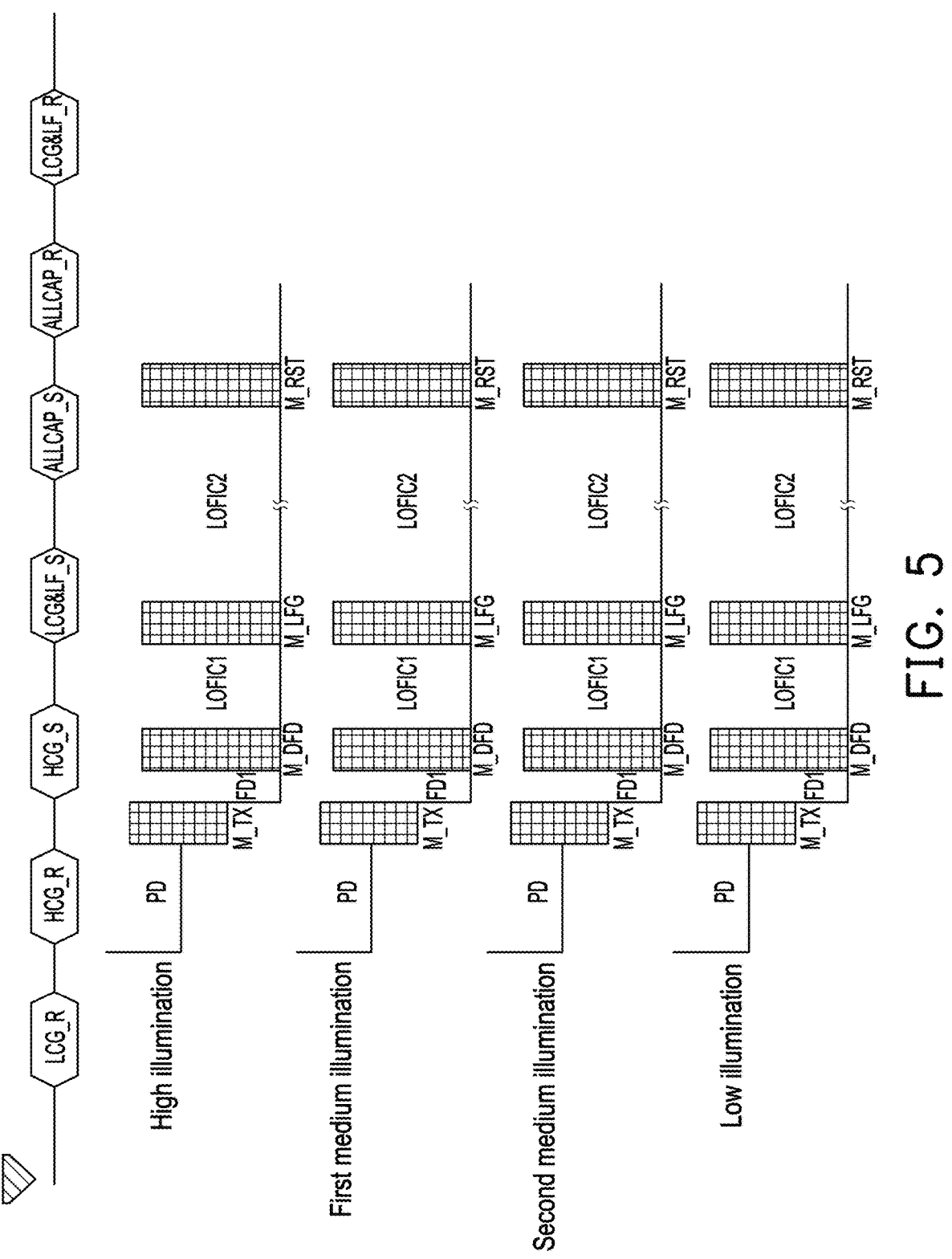
FIG. 5 to FIG. 17 are diagrams showing the distribution of photosensitive charges in the pixel circuit during different operational stages according to an embodiment of the disclosure.
Figure 6:
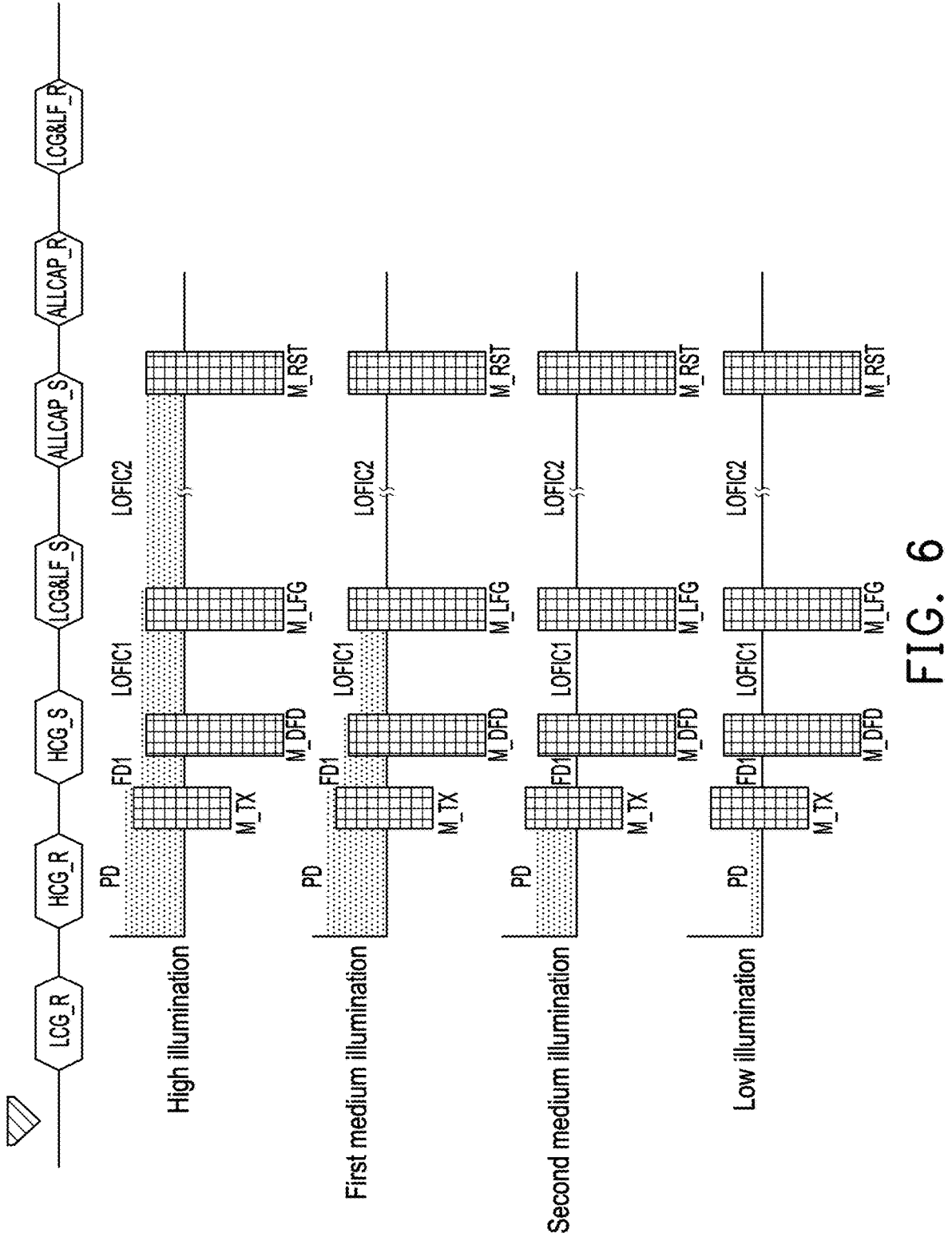
Figure 7:
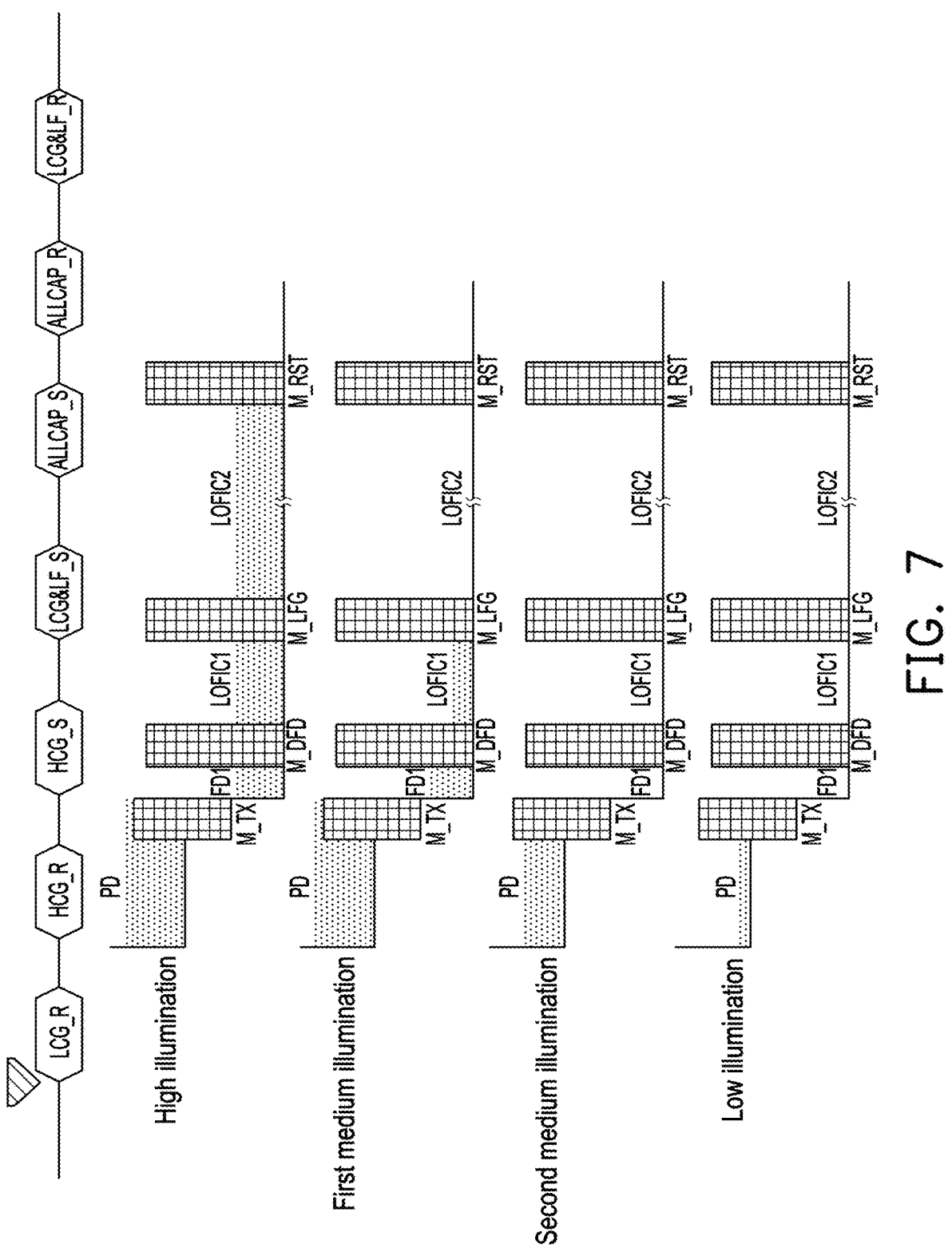

In the operation scenario shown in FIG. 5, the pixel circuit 200 operates during the precharge period. Therefore, the photodiode PD, the floating diffusion portion FD1, the LOFIC LOFIC1, and the LOFIC LOFIC2 are all reset (no photosensitive charge). In the operation scenario shown in FIG. 6, the pixel circuit 200 operates during the integration period (exposure period). During the integration period, the transistor M_DFD and the transistor M_LFG are not completely turned off. Therefore, the excess charges of the photodiode PD may overflow through the transfer transistor M_TX, the transistor M_DFD, and the transistor M_LFG to the floating diffusion portion FD1, the LOFIC LOFIC1, and/or the LOFIC LOFIC2. For instance, under second medium illumination and low illumination, the photodiode PD is not saturated, and therefore there is no charge overflowing to the floating diffusion portion FD1, the LOFIC LOFIC1, and/or the LOFIC LOFIC2. In an environment of first medium illumination, the excess charges of the photodiode PD may overflow through the transfer transistor M_TX and the transistor M_DFD to the floating diffusion portion FD1 and the LOFIC LOFIC1. In an environment of high illumination, the excess charges of the photodiode PD may overflow through the transfer transistor M_TX, the transistor M_DFD, and the transistor M_LFG to the floating diffusion portion FD1, the LOFIC LOFIC1, and the LOFIC LOFIC2. In the operation scenario shown in FIG. 7, the pixel circuit 200 is about to enter the readout cycle. Thus, the transistor M_DFD and the transistor M_LFG are completely turned off.

Figure 8:
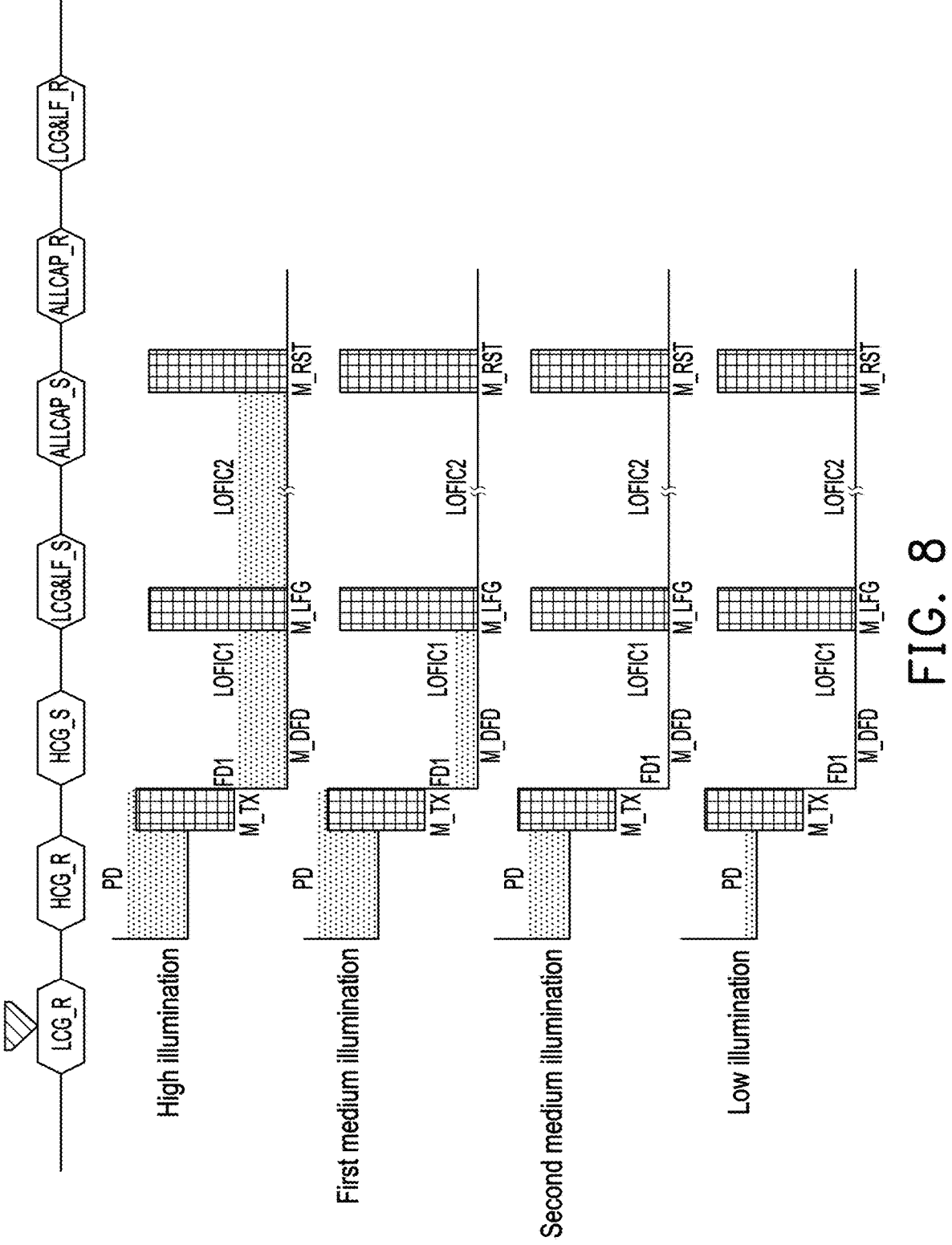

In the operation scenario shown in FIG. 8, the pixel circuit 200 operates in the first readout stage LCG_R. In the first readout stage LCG_R, the transistor M_DFD is turned on, and the transistor M_LFG and the transistor M_RST are turned off. Before the transfer transistor M_TX transfers the photosensitive charges of the photodiode PD (photosensitive element) to the floating diffusion portion FD1, the readout circuit 130 reads out the overflow charge value of the floating diffusion portion FD1 and the LOFIC LOFIC1 through the source follower circuit SF2.

Figure 9:
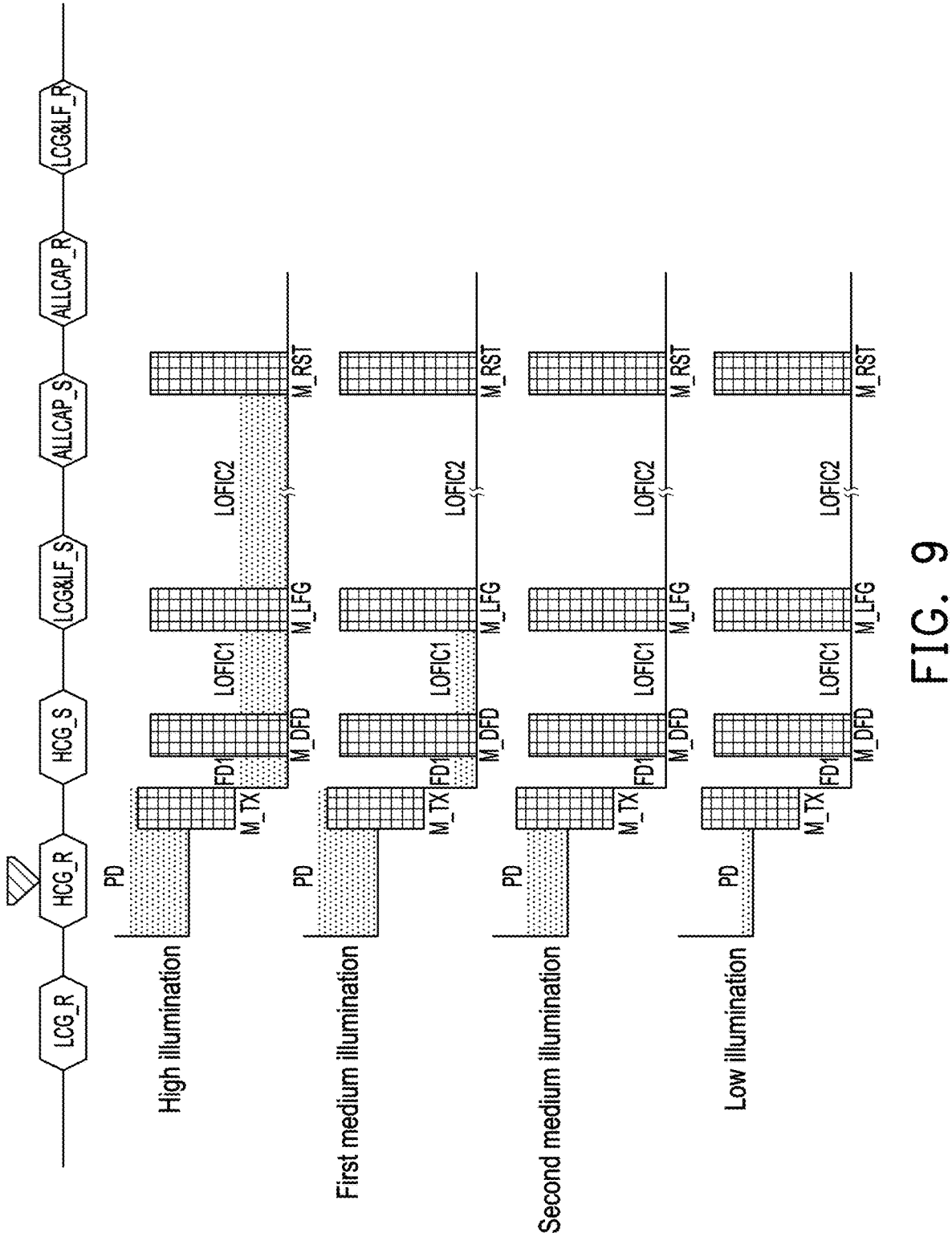

In the operation scenario shown in FIG. 9, the pixel circuit 200 operates in the readout stage HCG_R. In the readout stage HCG_R, the transistor M_DFD, the transistor M_LFG, and the transistor M_RST are turned off. Before the transfer transistor M_TX transfers the photosensitive charges of the photodiode PD to the floating diffusion portion FD1, the readout circuit 130 reads out the charge value of the floating diffusion portion FD1 through the source follower circuit SF2. For instance, under second medium illumination and low illumination, the source follower circuit SF2 reads out the reset charge value of the floating diffusion portion FD1. Under first medium illumination and high illumination, the source follower circuit SF2 reads out the overflow charge value of the floating diffusion portion FD1.

Figure 10:
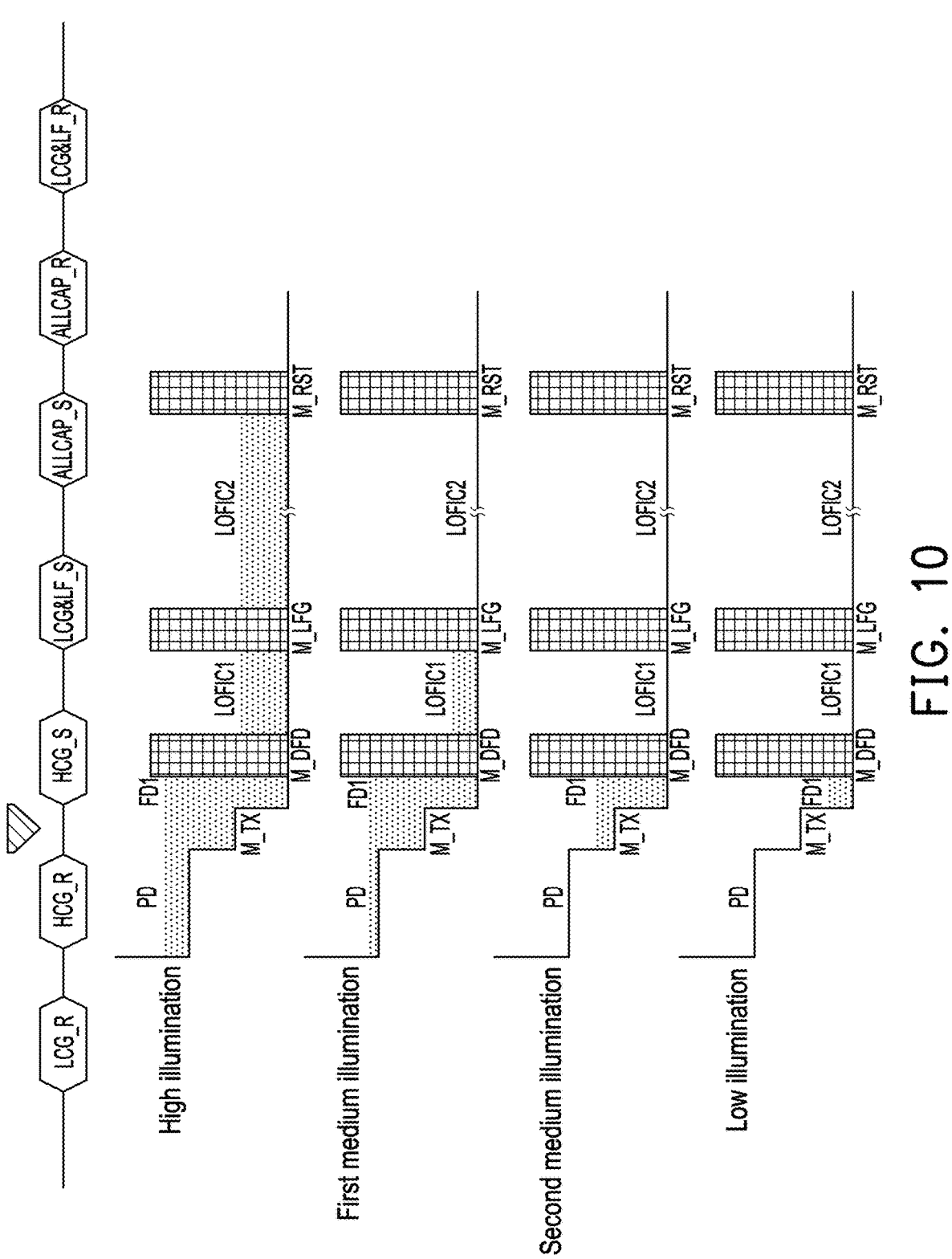
Figure 11:
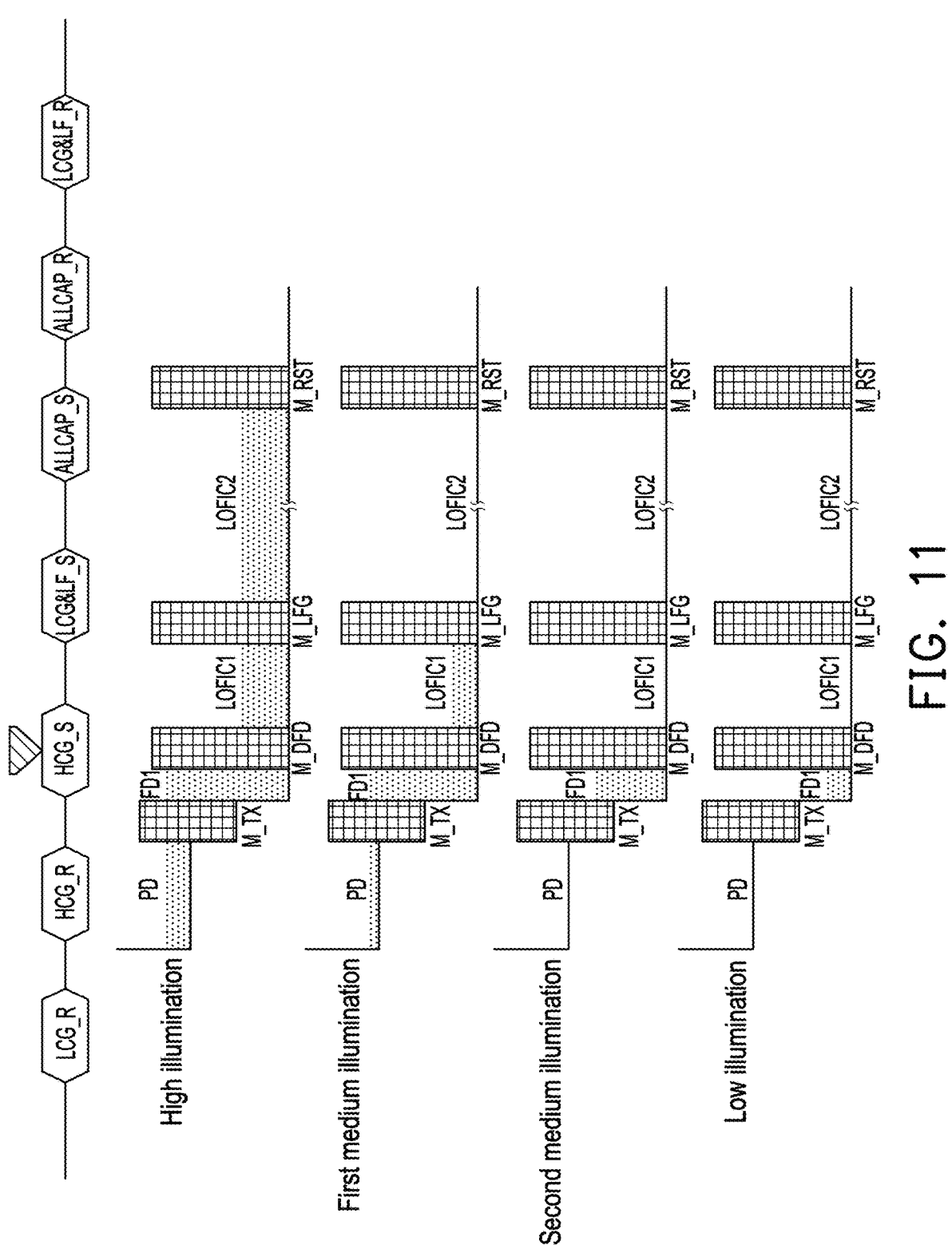

In the operation scenario shown in FIG. 10, the transfer transistor M_TX is turned on, which causes the photosensitive charges of the photodiode PD to be transferred to the floating diffusion portion FD1. In the operation scenario shown in FIG. 11, the pixel circuit 200 operates in the readout stage HCG_S. In the readout stage HCG_S, the transfer transistor M_TX, the transistor M_DFD, and the transistor M_LFG, and the transistor M_RST are turned off. After the transfer transistor M_TX transfers the photosensitive charges of the photodiode PD to the floating diffusion portion FD1, the source follower circuit SF2 reads out the photosensitive charge value of the floating diffusion portion FD1. The difference between the photosensitive charge value in the readout stage HCG_S and the original charge value in the readout stage HCG_R serves as the HCG sensing result. The HCG sensing result may serve as the low illumination sensing result (applicable to conditions of low illumination).

Figure 12:
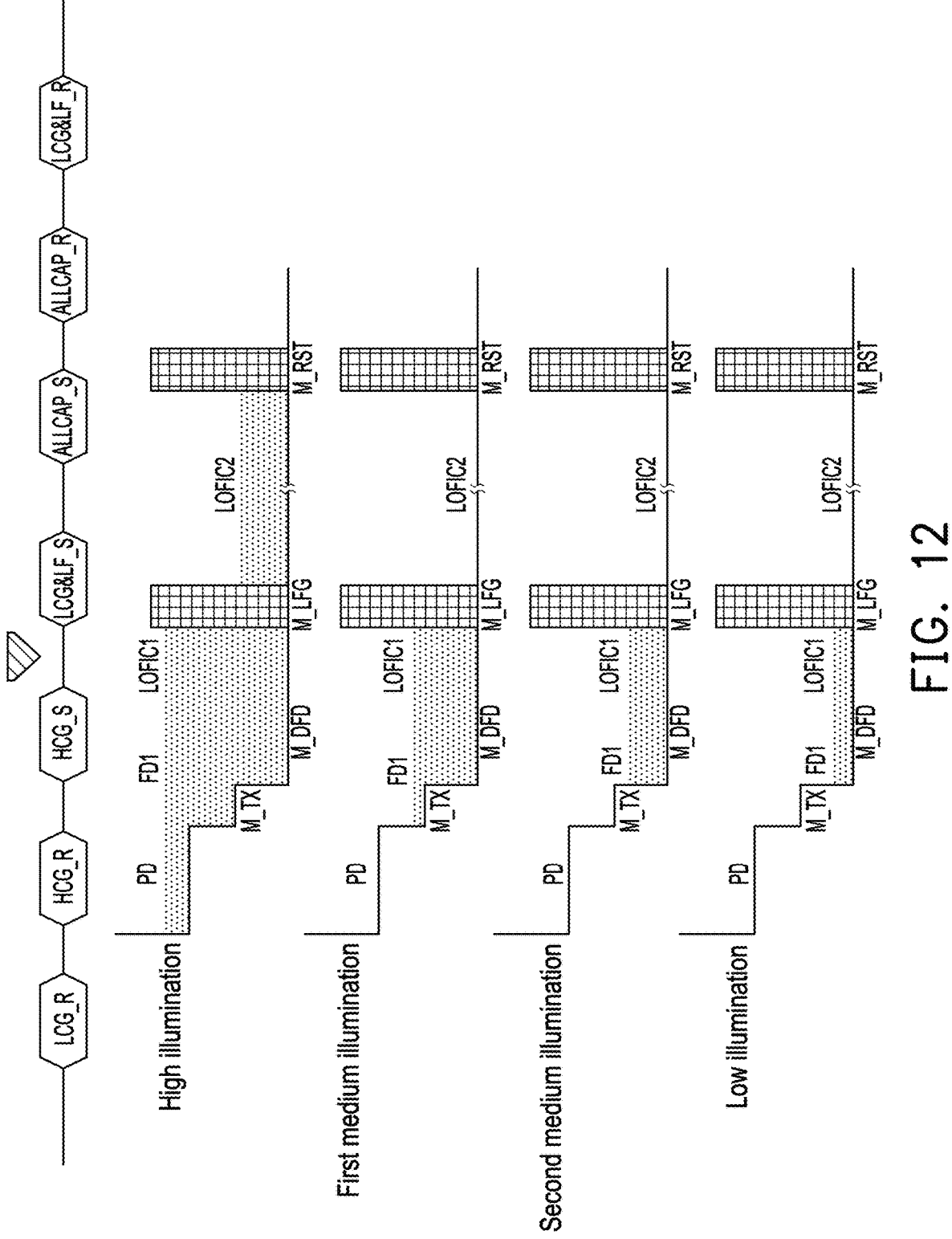
Figure 13:
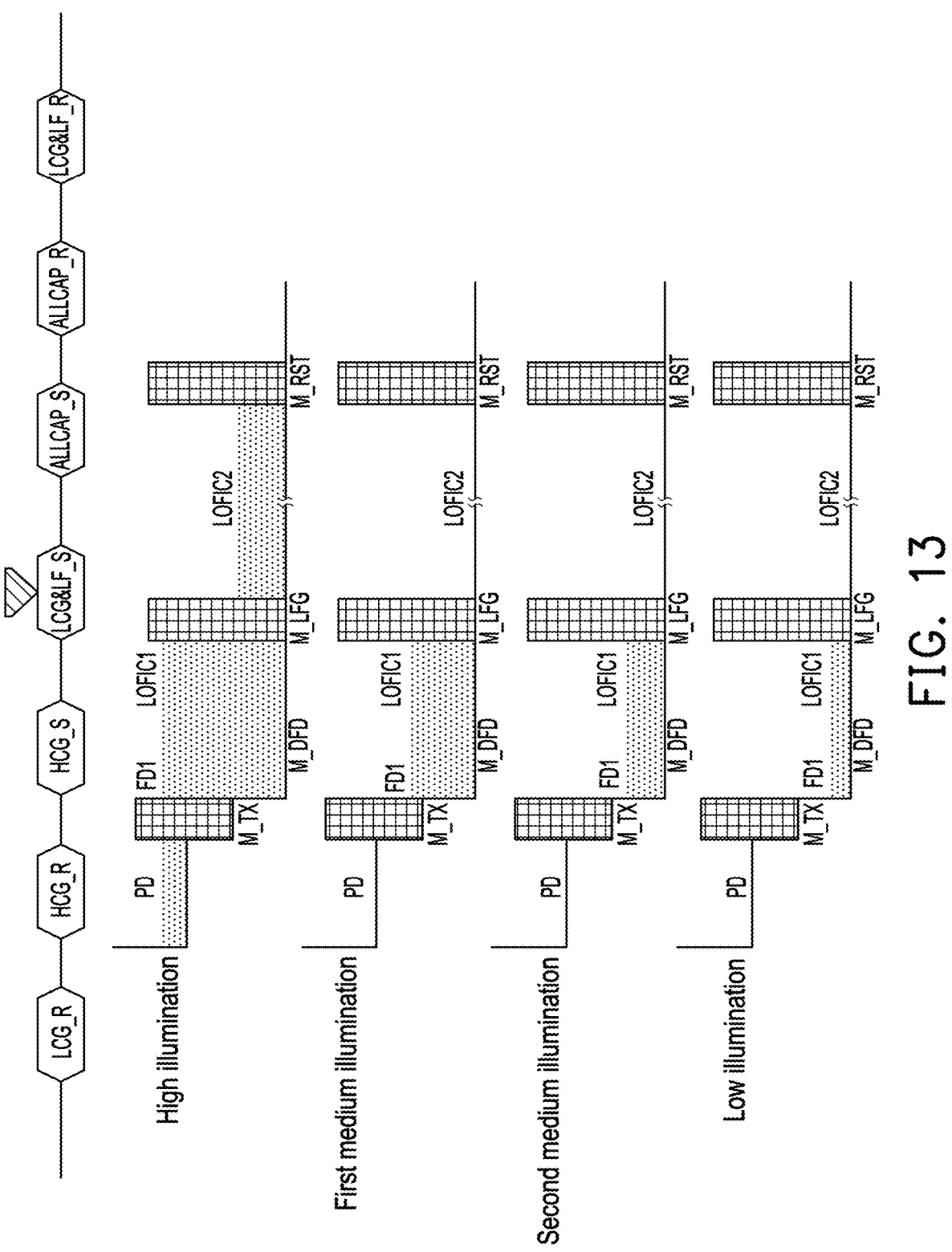

In the operation scenario shown in FIG. 12, the transistor M_TX and the transistor M_DFD are turned on, which causes the photosensitive charges of the photodiode PD to be transferred to the floating diffusion portion FD1 and the LOFIC LOFIC1. In the operation scenario shown in FIG. 13, the pixel circuit 200 operates in the second readout stage LCG&LF_S. In the second readout stage LCG&LF_S, the transistor M_DFD is turned on, and the transfer transistor M_TX, the transistor M_LFG, and the transistor M_RST are turned off. After the transfer transistor M_TX transfers the photosensitive charges of the photodiode PD to the floating diffusion portion FD1 and the LOFIC LOFIC1, the source follower circuit SF2 reads out the photosensitive charge value of the floating diffusion portion FD1 and the LOFIC LOFIC1. The difference between the photosensitive charge value in the second readout stage LCG&LF_S and the overflow charge value in the first readout stage LCG_R may serve as the LCG sensing result LCG4. The LCG sensing result LCG4 serves as the second medium illumination sensing result (applicable to conditions of second medium illumination).

Figure 14:
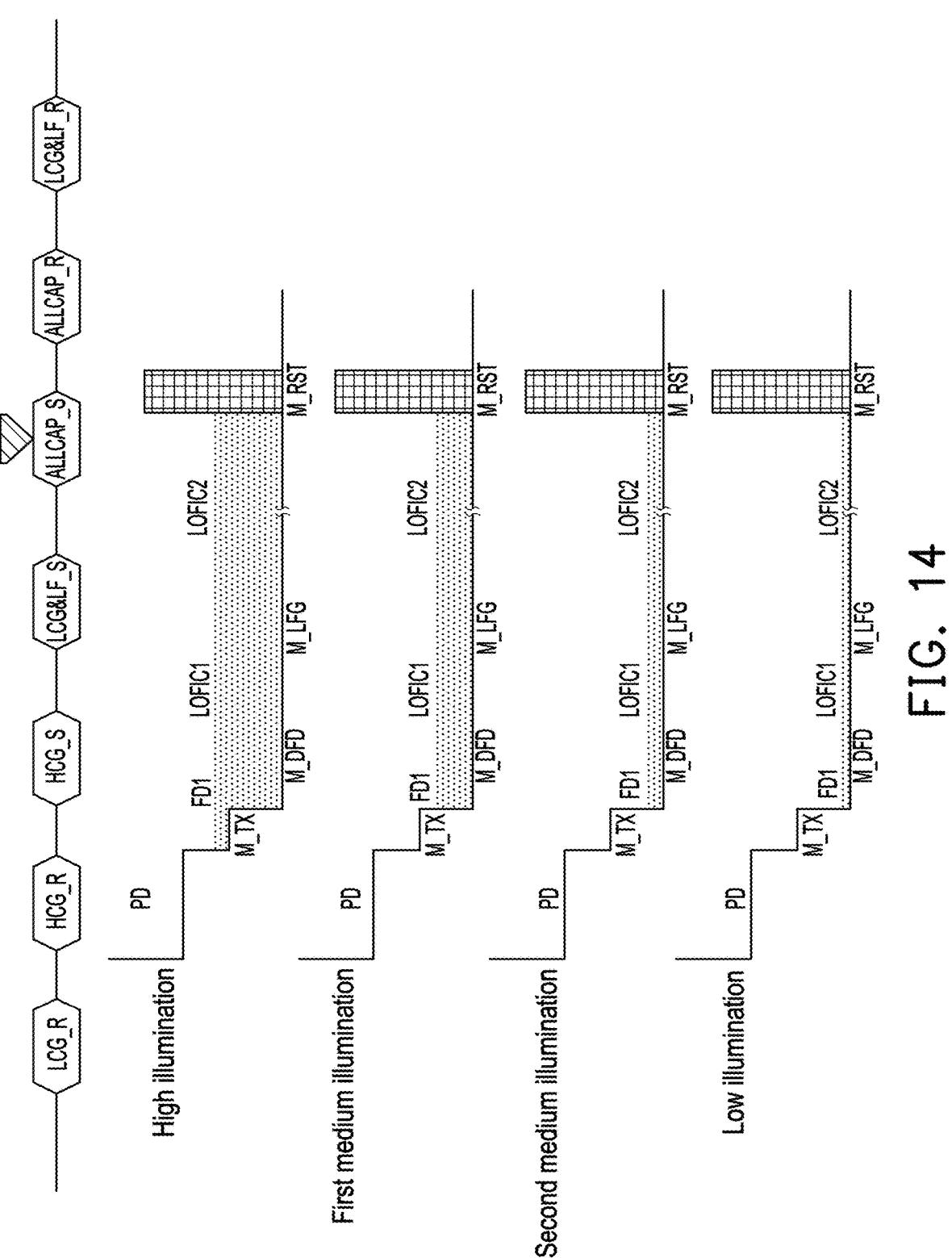

In the operation scenario shown in FIG. 14, the pixel circuit 200 operates in the readout stage ALLCAP_S. In the readout stage ALLCAP_S, the transfer transistor M_TX, the transistor M_DFD, and the transistor M_LFG are turned on, and the transistor M_RST is turned off. The source follower circuit SF2 reads out the photosensitive charge value of the floating diffusion portion FD1, the LOFIC LOFIC1, and the LOFIC LOFIC2 in the readout stage ALLCAP_S.

Figure 15:
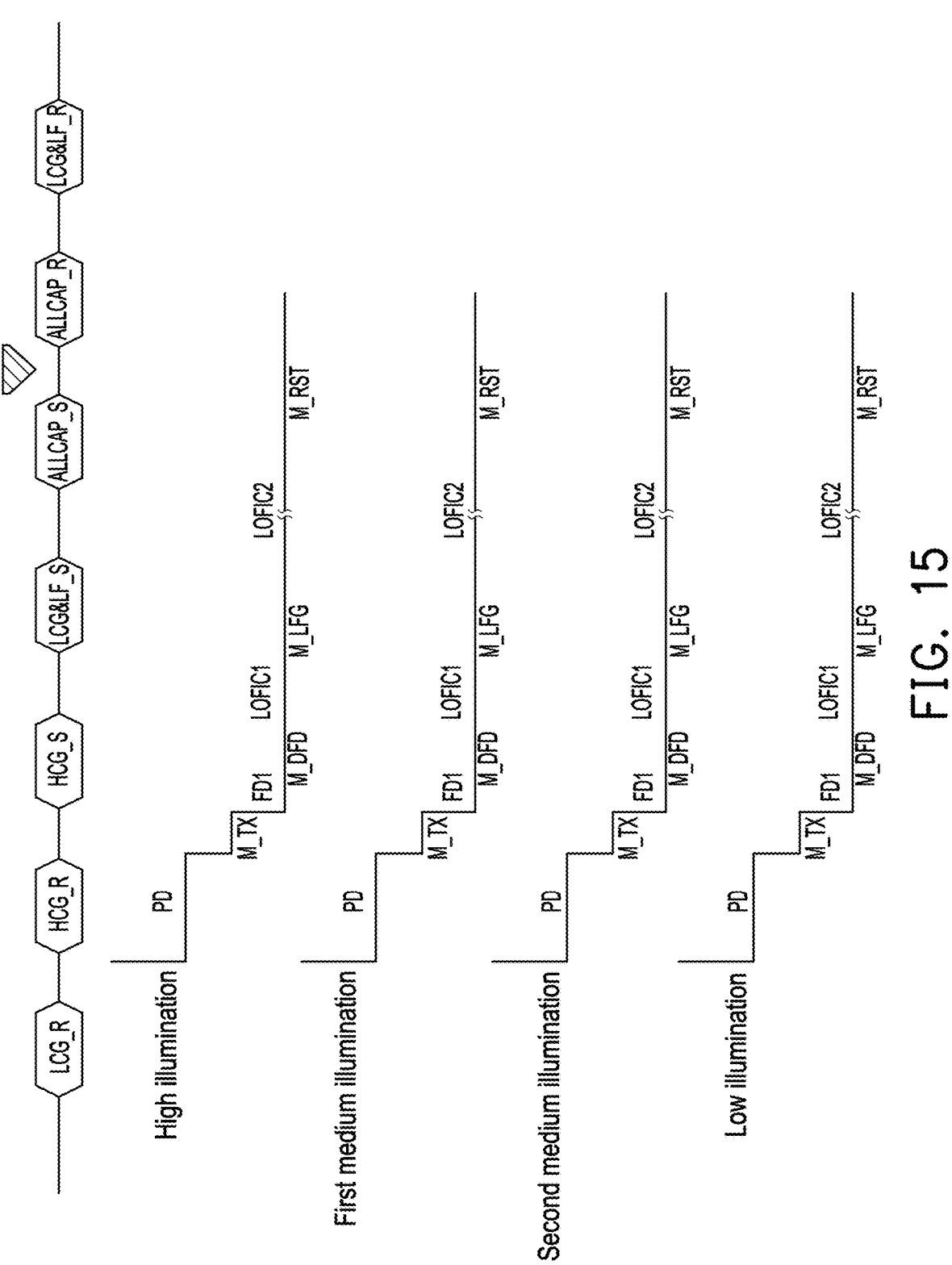
Figure 16:
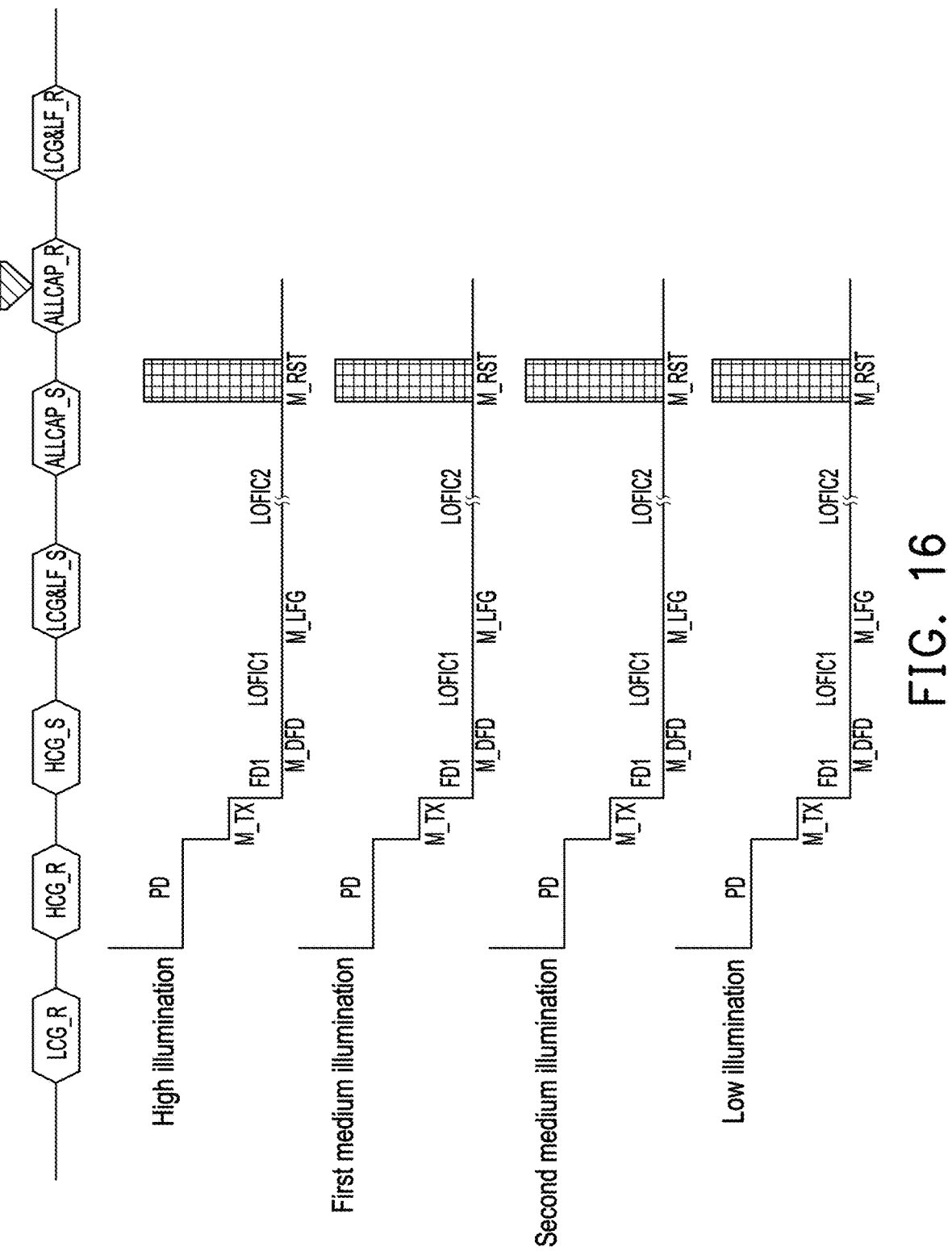

In the operation scenario shown in FIG. 15, the transfer transistor M_TX, the transistor M_DFD, the transistor M_LFG, and the transistor M_RST are turned on. Therefore, the photodiode PD, the floating diffusion portion FD1, the LOFIC LOFIC1, and the LOFIC LOFIC2 are all reset (photosensitive charges are cleared). In the operation scenario shown in FIG. 16, the pixel circuit 200 operates in the readout stage ALLCAP_R. In the readout stage ALLCAP_R, the transfer transistor M_TX, the transistor M_DFD, and the transistor M_LFG are turned on, and the transistor M_RST is turned off. After the photodiode PD, the floating diffusion portion FD1, the LOFIC LOFIC1, and the LOFIC LOFIC2 are all reset, the source follower circuit SF2 reads out the reset charge value of the photodiode PD, the floating diffusion portion FD1, the LOFIC LOFIC1, and the LOFIC LOFIC2. The difference between the photosensitive charge value in the readout stage ALLCAP_S and the reset charge value in the readout stage ALLCAP_R serves as the high illumination sensing result (applicable to conditions of high illumination).

13

Figure 17:
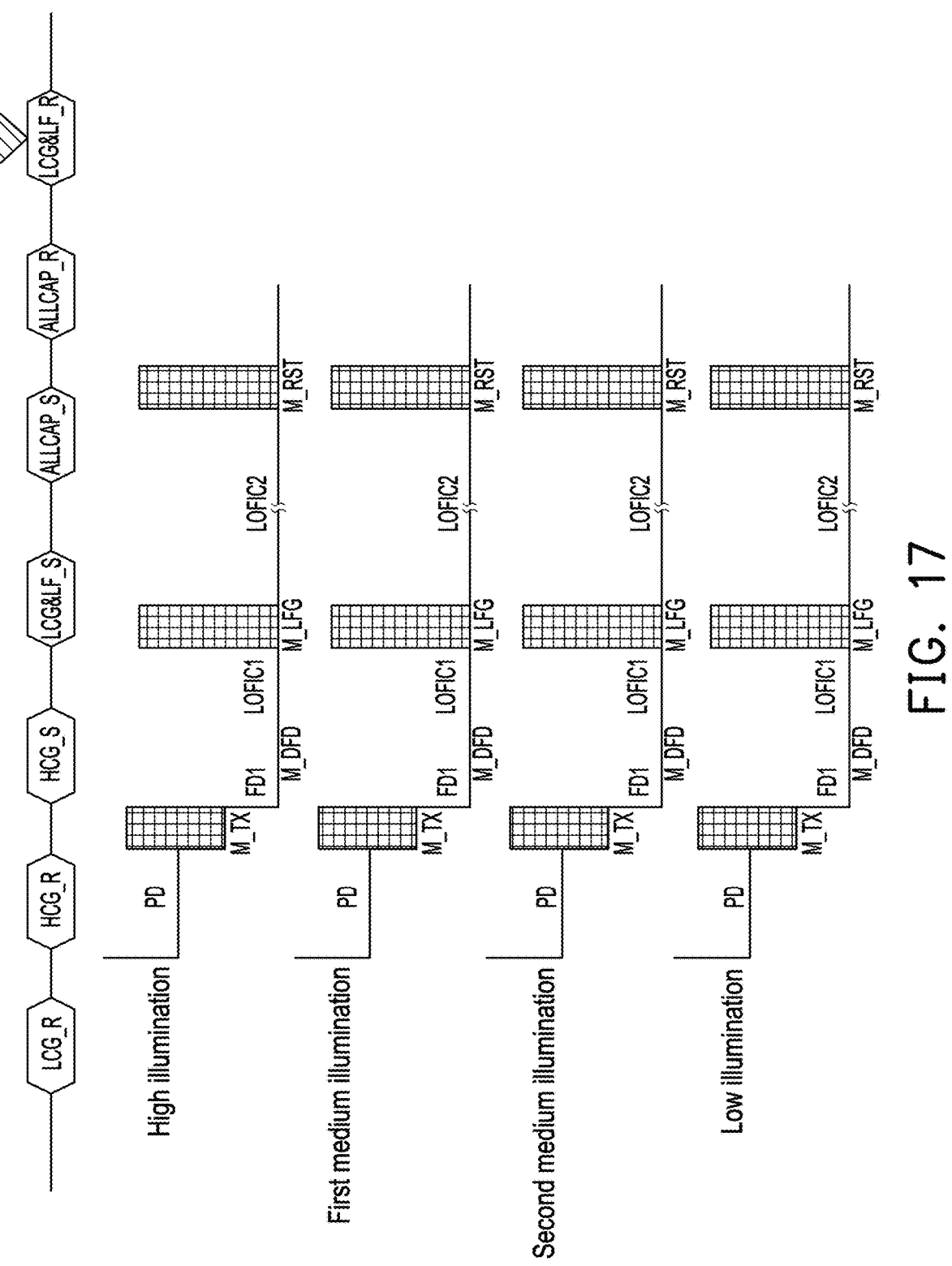

In the operation scenario shown in FIG. 17, the pixel circuit 200 operates in the third readout stage LCG&LF_R. In the third readout stage LCG&LF_R, the transistor M_DFD is turned on, and the transfer transistor M_TX, the transistor M_LFG, and the transistor M_RST are turned off. After the photodiode PD, the floating diffusion portion FD1, and the LOFIC LOFIC1 are reset, the source follower circuit SF2 reads out the reset charge value of the floating diffusion portion FD1 and the LOFIC LOFIC1. The difference between the photosensitive charge value in the second readout stage LCG&LF_S and the reset charge value in the third readout stage LCG&LF_R serves as the first medium illumination sensing result LF4 (applicable to conditions of first medium illumination).

Figure 18:
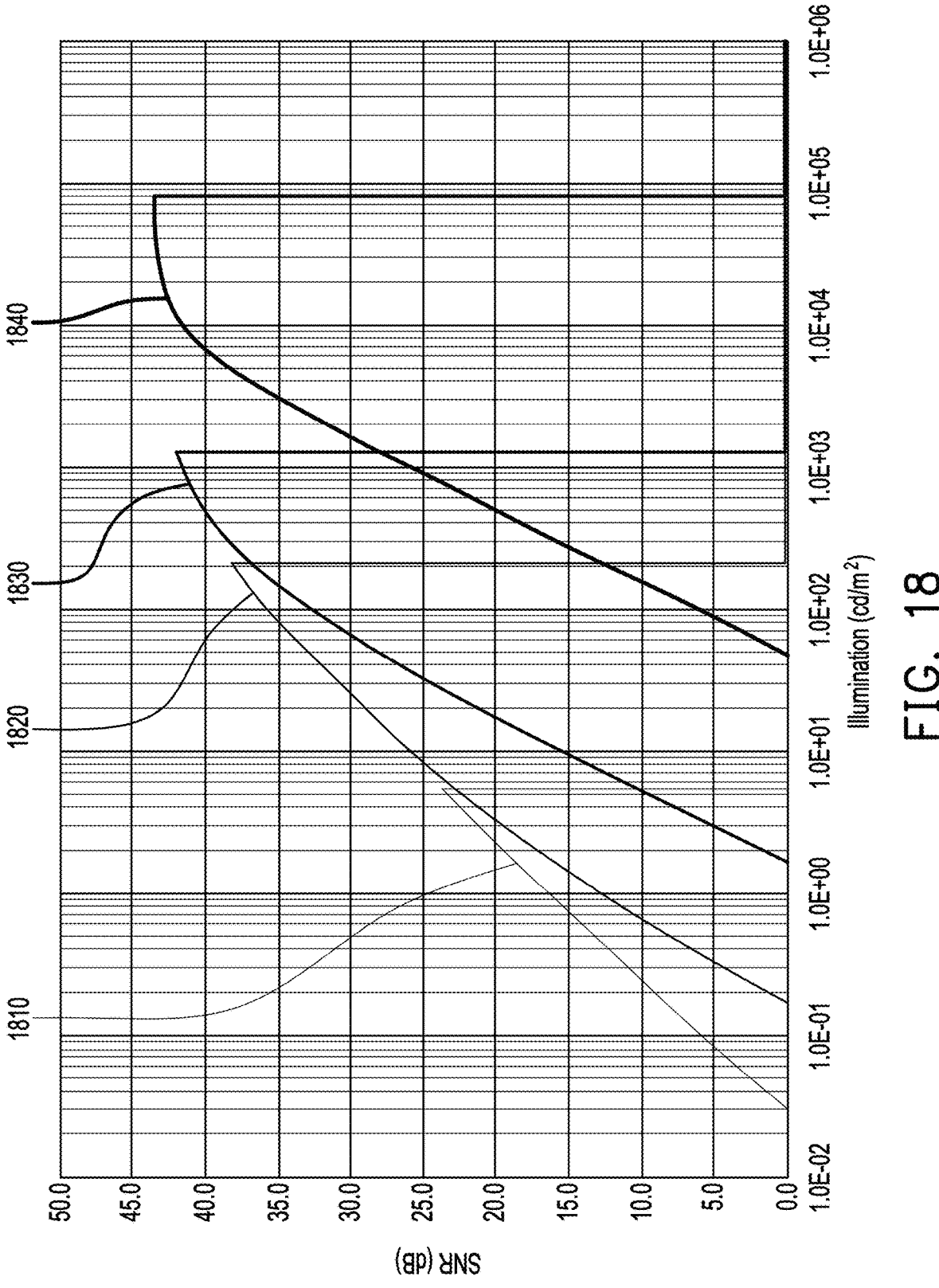
FIG. 18 is a diagram showing the signal-to-noise ratio (SNR) of the pixel circuit according to an embodiment of the disclosure.

FIG. 18 is a diagram showing the signal-to-noise ratio (SNR) of the pixel circuit according to an embodiment of the disclosure. The horizontal axis in FIG. 18 represents the illumination of incident light, and the vertical axis represents SNR. Referring to FIG. 4 and FIG. 18, curve 1810 shows the SNR response of the sensing result of the HCG readout operation HCG4 as the intensity of incident light increases. Curve 1820 shows the SNR response of the LCG sensing result LCG4 as the intensity of incident light increases. Curve 1830 shows the SNR response of the first medium illumination sensing result LF4 as the intensity of incident light increases. Curve 1840 shows the SNR response of the sensing result of the all-capacitor readout operation ALL-CAP4 as the intensity of incident light increases.

Although the disclosure has been described with reference to the foregoing embodiments, the embodiments are not intended to limit the disclosure. Any person having ordinary skill in the art may make changes and modifications without departing from the spirit and scope of the disclosure. Therefore, the scope of the disclosure will be defined by the appended claims.

What is claimed is:

1. An image sensor comprising:
a control circuit; and
a pixel array controlled by the control circuit, each pixel circuit of the pixel array comprising:
a photosensitive element;
a floating diffusion portion;
a transfer transistor coupled between the photosensitive element and the floating diffusion portion;
a source follower circuit coupled between a corresponding readout line of the pixel array and the floating diffusion portion;
a first transistor comprising a first terminal coupled to the floating diffusion portion;
a first capacitor comprising a first terminal coupled to a second terminal of the first transistor;
a second transistor comprising a first terminal coupled to the second terminal of the first transistor; and
a second capacitor comprising a first terminal coupled to a second terminal of the second transistor,
wherein a readout cycle of the control circuit for the pixel circuit comprises a high conversion gain (HCG) readout operation, a low conversion gain (LCG) and lateral overflow integration capacitor (LOFIC) readout operation, and an all-capacitor readout operation,
the HCG readout operation reads out an HCG sensing result corresponding to a first photosensitive charge value of the photosensitive element,
the all-capacitor readout operation reads out a high illumination sensing result corresponding to a second photosensitive charge value of the photosensitive element, the floating diffusion portion, the first capacitor, and the second capacitor, and
the LCG and LOFIC readout operation comprises:
a first readout stage in which an overflow charge value of the floating diffusion portion and the first capacitor is read out before the transfer transistor transfers photosensitive charges of the photosensitive element to the floating diffusion portion;
a second readout stage in which a third photosensitive charge value of the photosensitive element, the floating diffusion portion, and the first capacitor is read out, wherein a difference between the third photosensitive charge value and the overflow charge value serves as an LCG sensing result; and
a third readout stage in which a reset charge value of the floating diffusion portion and the first capacitor is read out after the photosensitive element, the floating diffusion portion, and the first capacitor are reset, wherein a difference between the third photosensitive charge value and the reset charge value serves as a first medium illumination sensing result.

2. The image sensor as claimed in claim 1, wherein a capacity of the second capacitor is greater than a capacity of the first capacitor, and the capacity of the first capacitor is greater than a capacity of the floating diffusion portion.

3. The image sensor as claimed in claim 1, wherein the photosensitive element comprises a photodiode,
the first capacitor comprises a metal-oxide-metal capacitor as a first LOFIC, and
the second capacitor comprises a three-dimensional metal-insulator-metal capacitor as a second LOFIC.

4. The image sensor as claimed in claim 1, wherein the source follower circuit comprises:
a source follower transistor comprising a control terminal coupled to the floating diffusion portion, wherein a first terminal of the source follower transistor is coupled to a pixel voltage source; and
a row select transistor comprising a control terminal coupled to the control circuit to receive a row select signal, wherein a first terminal of the row select transistor is coupled to a second terminal of the source follower transistor, and a second terminal of the row select transistor is coupled to the corresponding readout line.

5. The image sensor as claimed in claim 1, wherein a second terminal of the first capacitor is coupled to the control circuit to receive a floating diffusion capacitor signal, and the image sensor further comprises:
a first reset circuit coupled to the second terminal of the second transistor, wherein the first reset circuit is controlled by the control circuit to selectively reset the pixel circuit; and
a second reset circuit coupled to a second terminal of the second capacitor.

6. The image sensor as claimed in claim 5, wherein the first reset circuit comprises:
a first reset transistor coupled between the second terminal of the second transistor and a reset voltage source, wherein the first reset transistor switching in response to a first reset signal of the control circuit, the first reset transistor is turned on during an idle period, and the first reset transistor is turned off during an integration period.

7. The image sensor as claimed in claim 6, wherein the second reset circuit comprises:
a second reset transistor coupled between the second terminal of the second capacitor and the reset voltage source, wherein the second reset transistor switching in response to a second reset signal of the control circuit; and a switch coupled between the second terminal of the second capacitor and a bias voltage source, wherein a bias voltage provided by the bias voltage source being less than a reset voltage provided by the reset voltage source.

8. The image sensor as claimed in claim 1, wherein the HCG readout operation comprises:

a fourth readout stage in which an original charge value of the floating diffusion portion is read out by the source follower circuit before the transfer transistor transfers the photosensitive charges of the photosensitive element to the floating diffusion portion; and a fifth readout stage in which a fourth photosensitive charge value of the floating diffusion portion is read out by the source follower circuit after the transfer transistor transfers the photosensitive charges of the photosensitive element to the floating diffusion portion, wherein a difference between the fourth photosensitive charge value and the original charge value serves as the HCG sensing result.

9. The image sensor as claimed in claim 1, wherein the all-capacitor readout operation comprises:

a fourth readout stage in which a fourth photosensitive charge value of the photosensitive element, the floating diffusion portion, the first capacitor, and the second capacitor is read out by the source follower circuit in response to the transfer transistor, the first transistor, and the second transistor being turned on; and a fifth readout stage in which a reset charge value of the photosensitive element, the floating diffusion portion, the first capacitor, and the second capacitor is read out by the source follower circuit after the photosensitive element, the floating diffusion portion, the first capacitor, and the second capacitor are all reset, wherein a difference between the fourth photosensitive charge value and the reset charge value serves as the high illumination sensing result.

10. The image sensor as claimed in claim 1, wherein the HCG sensing result serves as a low illumination sensing result, the LCG sensing result serves as a second medium illumination sensing result, a highest illumination to which the high illumination sensing result is applicable is higher than a highest illumination to which the first medium illumination sensing result is applicable, the highest illumination to which the first medium illumination sensing result is applicable is higher than a highest illumination to which the second medium illumination sensing result is applicable, and the highest illumination to which the second medium illumination sensing result is applicable is higher than a highest illumination to which the low illumination sensing result is applicable.

11. The image sensor as claimed in claim 1, wherein, before the readout cycle, the control circuit performs a precharge operation and an integration operation on the pixel circuit; and during the readout cycle, the control circuit sequentially performs the first readout stage, the HCG readout operation, the second readout stage, the all-capacitor readout operation, and the third readout stage on the pixel circuit.

12. A readout method for a pixel circuit comprising:

performing an high conversion gain (HCG) readout operation in a readout cycle of the pixel circuit to read out an HCG sensing result corresponding to a first photosensitive charge value of a photosensitive element of the pixel circuit, wherein a transfer transistor of the pixel circuit is coupled between the photosensitive element and a floating diffusion portion of the pixel circuit, a source follower circuit of the pixel circuit is coupled between a corresponding readout line of the pixel circuit and the floating diffusion portion, a first terminal of a first transistor of the pixel circuit is coupled to the floating diffusion portion, a first terminal of a first capacitor of the pixel circuit is coupled to a second terminal of the first transistor, a first terminal of a second transistor of the pixel circuit is coupled to the second terminal of the first transistor, and a first terminal of a second capacitor of the pixel circuit is coupled to a second terminal of the second transistor;

performing an all-capacitor readout operation in the readout cycle to read out a high illumination sensing result corresponding to a second photosensitive charge value of the photosensitive element, the floating diffusion portion, the first capacitor, and the second capacitor; and performing a low conversion gain (LCG) and lateral overflow integration capacitor (LOFIC) readout operation in the readout cycle, wherein the LCG and LOFIC readout operation comprises:

a first readout stage in which an overflow charge value of the floating diffusion portion and the first capacitor is read out before the transfer transistor transfers photosensitive charges of the photosensitive element to the floating diffusion portion;

a second readout stage in which a third photosensitive charge value of the photosensitive element, the floating diffusion portion, and the first capacitor is read out, wherein a difference between the third photosensitive charge value and the overflow charge value serves as an LCG sensing result; and a third readout stage in which a reset charge value of the floating diffusion portion and the first capacitor is read out after the photosensitive element, the floating diffusion portion, and the first capacitor are reset, wherein a difference between the third photosensitive charge value and the reset charge value serves as a first medium illumination sensing result.

13. The readout method as claimed in claim 12, wherein a capacity of the second capacitor is greater than a capacity of the first capacitor, and the capacity of the first capacitor is greater than a capacity of the floating diffusion portion.

14. The readout method as claimed in claim 12, wherein the photosensitive element comprises a photodiode, the first capacitor comprises a metal-oxide-metal capacitor as a first LOFIC, and the second capacitor comprises a three-dimensional metal-insulator-metal capacitor as a second LOFIC.

15. The readout method as claimed in claim 12, wherein a second terminal of the first capacitor receives a floating diffusion capacitor signal, a first reset circuit of the pixel circuit is coupled to the second terminal of the second transistor, a second reset circuit of the pixel circuit is coupled to a second terminal of the second capacitor, and the readout method further comprises:

selectively resetting the pixel circuit by the first reset circuit.

16. The readout method as claimed in claim 15 further comprising:

switching a first reset transistor of the first reset circuit in response to a first reset signal, wherein the first reset transistor is coupled between the second terminal of the second transistor and a reset voltage source;

turning on the first reset transistor during an idle period; and turning off the first reset transistor during an integration period.

17. The readout method as claimed in claim 16 further comprising:

switching a second reset transistor of the second reset circuit in response to a second reset signal, wherein the second reset transistor is coupled between the second terminal of the second capacitor and the reset voltage source, a switch of the second reset circuit is coupled between the second terminal of the second capacitor and a bias voltage source, and a bias voltage provided by the bias voltage source is less than a reset voltage provided by the reset voltage source.

18. The readout method as claimed in claim 12, wherein the HCG readout operation comprises:

a fourth readout stage in which an original charge value of the floating diffusion portion is read out by the source follower circuit before the transfer transistor transfers the photosensitive charges of the photosensitive element to the floating diffusion portion; and a fifth readout stage in which a fourth photosensitive charge value of the floating diffusion portion is read out by the source follower circuit after the transfer transistor transfers the photosensitive charges of the photosensitive element to the floating diffusion portion, wherein a difference between the fourth photosensitive charge value and the original charge value serves as the HCG sensing result.

19. The readout method as claimed in claim 12, wherein the all-capacitor readout operation comprises:

a fourth readout stage in which a fourth photosensitive charge value of the photosensitive element, the floating diffusion portion, the first capacitor, and the second capacitor is read out by the source follower circuit in response to the transfer transistor, the first transistor, and the second transistor being turned on; and a fifth readout stage in which a reset charge value of the photosensitive element, the floating diffusion portion, the first capacitor, and the second capacitor is read out by the source follower circuit after the photosensitive element, the floating diffusion portion, the first capacitor, and the second capacitor are all reset, wherein a difference between the fourth photosensitive charge value and the reset charge value serves as the high illumination sensing result.

20. The readout method as claimed in claim 12, wherein the HCG sensing result serves as a low illumination sensing result, the LCG sensing result serves as a second medium illumination sensing result, a highest illumination to which the high illumination sensing result is applicable is higher than a highest illumination to which the first medium illumination sensing result is applicable, the highest illumination to which the first medium illumination sensing result is applicable is higher than a highest illumination to which the second medium illumination sensing result is applicable, and the highest illumination to which the second medium illumination sensing result is applicable is higher than a highest illumination to which the low illumination sensing result is applicable.

21. The readout method as claimed in claim 12, further comprising:

performing a precharge operation and an integration operation on the pixel circuit before the readout cycle; and sequentially performing the first readout stage, the HCG readout operation, the second readout stage, the all-capacitor readout operation, and the third readout stage on the pixel circuit during the readout cycle.

* * * * *